(12) United States Patent
Li et al.

(10) Patent No.: US 11,018,488 B2
(45) Date of Patent: May 25, 2021

(54) CLIMATE RESPONSIVE TRANSMISSION LINES

(71) Applicant: NEWSOUTH INNOVATIONS PTY LIMITED, Sydney (AU)

(72) Inventors: Sean Suixiang Li, Turramurra (AU); Rong Zeng, Carlton (AU)

(73) Assignee: NEWSOUTH INNOVATIONS PTY LIMITED, Sydney (AU)

( * ) Notice: Subject to any disclaimer, the term of this patent is extended or adjusted under 35 U.S.C. 154(b) by 360 days.

(21) Appl. No.: 16/063,404

(22) PCT Filed: Dec. 16, 2016

(86) PCT No.: PCT/AU2016/051241
§ 371 (c)(1),
(2) Date: Jun. 18, 2018

(87) PCT Pub. No.: WO2017/100851
PCT Pub. Date: Jun. 22, 2017

(65) Prior Publication Data
US 2020/0274345 A1    Aug. 27, 2020

(30) Foreign Application Priority Data
Dec. 16, 2015  (AU) ............................... 2015905212

(51) Int. Cl.
*H01B 7/16*   (2006.01)
*H02G 7/16*   (2006.01)
(Continued)

(52) U.S. Cl.
CPC .............. *H02G 7/16* (2013.01); *H01B 9/008* (2013.01); *H05B 6/00* (2013.01); *G06F 30/20* (2020.01)

(58) Field of Classification Search
CPC ... H01B 5/10; H01B 7/28; H01B 7/16; H01B 5/002; H01B 5/102; H02G 7/06;
(Continued)

(56) References Cited

U.S. PATENT DOCUMENTS 3,218,384 A    11/1965  Shaw
3,296,364 A *  1/1967   Mason .................... C22C 19/03
                                                174/106 R
(Continued)

FOREIGN PATENT DOCUMENTS

CN    1016625909    1/2010
CN    101638549     2/2010
(Continued)

OTHER PUBLICATIONS

International Search Report with Written Opinion for Application No. PCT/AU2016/051241 dated Jun. 22, 2017 (10 pages).

*Primary Examiner* — William H. Mayo, III
(74) *Attorney, Agent, or Firm* — Michael Best & Friedrich LLP

(57) ABSTRACT

An electrical power transmission line conductor having a bundle of at least one electrical conductor configured for transmission of high voltage alternating current electrical power, at least one strengthening structure bundled with the electrical conductor to provide physical support to the electrical conductor, and at least one magnetocaloric structure having magnetocaloric material. A changing magnetic field generated by transmission of high voltage alternating current electrical power via the at least one conductor causes the magnetocaloric material composition to exhibit a magnetocaloric effect to regulate the operating temperature of the electrical power transmission line conductor.

20 Claims, 14 Drawing Sheets

Basic heating/cooling cycling principle of magnetocaloric effects

(51) Int. Cl.
 *H01B 9/00* (2006.01)
 *H05B 6/00* (2006.01)
 *G06F 30/20* (2020.01)

(58) Field of Classification Search
 CPC .. H02G 7/12; H02G 7/14; H02G 7/20; H02G 15/117
 USPC ............... 174/40 R, 41, 43, 45 R, 45 TD
 See application file for complete search history.

(56) References Cited

U.S. PATENT DOCUMENTS

| | | | | | |
|---|---|---|---|---|---|
| 3,909,555 | A | * | 9/1975 | Harris | H01B 7/221 |
| | | | | | 174/102 P |
| 4,525,432 | A | * | 6/1985 | Saito | H01B 1/023 |
| | | | | | 428/653 |
| 6,207,939 | B1 | * | 3/2001 | Allaire | D07B 1/147 |
| | | | | | 219/600 |

FOREIGN PATENT DOCUMENTS

| | | | | | |
|---|---|---|---|---|---|
| CN | 101638549 | A | * | 2/2010 | .......... C09D 163/00 |
| CN | 103435893 | | | 12/2012 | |
| CN | 104733077 | | | 6/2015 | |
| CN | 104919544 | A | | 9/2015 | |
| EP | 0391719 | | | 10/1990 | |
| JP | H0836919 | | | 2/1996 | |
| JP | 2006-196375 | A | * | 7/2006 | .............. H01B 5/10 |
| JP | 2006196375 | | | 7/2006 | |
| JP | 2006340426 | | | 12/2006 | |
| JP | 2015042104 | | | 3/2015 | |
| WO | 2014115057 | A1 | | 7/2014 | |

\* cited by examiner

Basic heating/cooling cycling principle of magnetocaloric effects

CLIMATE RESPONSIVE TRANSMISSION LINES

TECHNICAL FIELD

The technical field of the present invention is electrical transmission line maintenance technology and in particular maintenance of transmission lines in extreme temperature environments.

BACKGROUND

The electric power grid is a national security and economic lifeline. It is a critical piece of infrastructure. In many countries or areas in high latitude, ice-cladding on overhead transmission lines is a major risk that can potentially destroy power grid systems and cause significant financial loss in cold winters (some examples are shown in FIG. 1). For example, it caused a direct loss of U$20 billion with more than 25 million families without power for one week during a transmission line icing disaster in south eastern China during the winter of 2008. In this disaster ice of around 40-60 mm thick coated transmission lines, affecting 17 provinces and around 100 million people. In 1998 on the border of North American and Canada high voltage power line towers failed, leaving over 2 million people without electricity for weeks. Consequences of this disaster included 25 deaths and several billion dollars damage.

Aiming to avoid such disasters several different transmission line de-icing techniques have been developed. Mechanical or robot de-icing, DC de-icing, AC short-circuit de-icing and over-load de-icing etc. have been used to attempt to solve this longstanding and critical problem. Using conventional magnetic materials to generate heat is another known technique to de-ice electric transmission lines. However, this technology generates the heat 24/7 regardless of ambient temperature, causing significant energy loss and transmission line sagging in summer. A problem is that all of these techniques exhaust huge energy and human resources. In the remote areas, de-icing becomes extremely difficult.

Another problem is that for the countries or areas in lower latitude, the operating temperature of the over-head transmission lines is often higher than 120° C. in the peak of summer, resulting in serious sagging of power lines. The extent to which extreme heat may affect overhead transmission lines and cause "sagging" is illustrated in FIG. 2. For example, some sagging 210 will typically be expected at a normal spring/summer operating temperature of around 75° C. Contributing to the operating temperature is solar radiation absorption and waste heat generated resulting from electrical resistance in the transmission lines (heat being one form of transmission line energy loss). However, on a very sunny day with high ambient temperature the operating temperature of the transmission line will increase, for example to above 120° C., or even 150° C.-210° C. in extreme heat conditions.

Events such as grass or bush fires can cause further increase in operating temperature. Some additional sagging 220 is expected in hot conditions due to thermal expansion of the transmission lines and typically transmission lines are installed to allow some additional, heat induced, sag before exceeding a minimum clearance threshold 230. The minimum clearance threshold is typically set in consideration of safety, for example to maintain a safe distance between the transmission lines and trees, terrain, infrastructure etc.

The safety of the electric power grids is significantly threatened by severe weather changes, and in particular extreme temperatures. There is a need to develop electric transmission line technology which can efficiently mitigate problems associated with extreme temperature conditions, for electrical grid systems in cold and hot areas.

SUMMARY OF THE INVENTION

An aspect of the present invention provides an electrical power transmission line conductor comprising:
- at least one electrical conductor configured for transmission of high voltage alternating current electrical power;
- at least one strengthening structure bundled with the electrical conductor to provide physical support to the and electrical conductor; and
- at least one magnetocaloric structure comprising magnetocaloric material, the at least one magnetocaloric structure being included in a bundle with the electrical conductor and strengthening structure,
- the magnetocaloric structure being arranged within the bundle to be located within a changing magnetic field generated by transmission of high voltage alternating current electrical power via the at least one conductor to thereby cause the magnetocaloric material composition to exhibit a magnetocaloric effect to regulate the operating temperature of the electrical power transmission line conductor.

In an embodiment the magnetocaloric effect operates to regulate the operating temperature of the electrical power transmission line conductor to maintain operating temperature above a range where icing occurs.

In an embodiment the magnetocaloric effect operates to regulate the operating temperature of the electrical power transmission line conductor to maintain operating temperature below a high temperature threshold.

In an embodiment the magnetocaloric effect operates to regulate the operating temperature of the electrical power transmission line conductor to maintain operating temperature within a target operating range.

The magnetocaloric material composition for each magnetocaloric structure can be tuned to exhibit the magnetocaloric effect within a target temperature range.

In some embodiments of the electrical power transmission line conductors each magnetocaloric structure is configured as an elongate wire comprising the magnetocaloric material, the wire being incorporated into the bundle with the electrical conductor and strengthening structure. For example, each magnetocaloric structure can be formed using a power-in-tube method for forming the elongate wire comprising the magnetocaloric material.

In some embodiments of the electrical power transmission line conductors one or more of the magnetocaloric structures include magnetocaloric material configured to exhibit magnetocaloric effects to cause warming of the electrical power transmission line conductor at temperatures below an icing threshold temperature. Examples of the magnetocaloric material have material compositions including any one or more of: $La_{0.7}(Ca_{1-x}Ag_x)_{0.3}MnO_3$, $La_{0.7}Ca_{0.3}MnO_3$, $LaMnO_3$, $MnCoGe$, $MnAs$, $Mn_{1-x}Fe_xAs$ $MnCoGe$, $LaFe_{11.6}Si_{1.4}$, $La(FeSi)_{13}$, $La_{0.8}Nd_{0.2}Fe_{11.5}Si_{1.5}$, $Ni_{43}Mn_{46}Sn_{11}$, $(Mn_{1-x}Ni_x)_3Sn_2$, and $RMnO_3$, The magnetocaloric material composition can be tuned to exhibit the magnetocaloric effect below the icing threshold temperature by doping using any one or more of gold (Ag), cobalt (Co), copper (Cu), boron (B), hydrogen (H) or gadolinium (Gd).

The icing threshold temperature can be a temperature selected from a range of 5° C. to 0° C. Embodiments of the electrical power transmission line conductor can include magnetocaloric material configured to exhibit magnetocaloric effects to cause warming of the electrical power transmission line conductor to regulate the operating temperature to within a range of 5° C. to 0° C. in ambient temperatures in the range of 5° C. to −50° C.

In some embodiments of the electrical power transmission line conductors one or more of the magnetocaloric structures include magnetocaloric material configured to exhibit magnetocaloric effects to cause cooling of the electrical power transmission line conductor at temperatures above a high-heat threshold temperature. For example the magnetocaloric material may comprise any one or more of: Zn doped $Fe_3O_4$; $Ni_{0.50}Mn_{0.50-x}Sn_x$, $Ni_{0.50}Mn_{0.50-x}In_x$ and $Ni_{0.50}Mn_{0.50-x}Sb_x$ alloys; and $LaCrO_3$. Other materials may also be found suitable. The magnetocaloric material composition can be tuned to exhibit the magnetocaloric effect above the high-heat threshold temperature by doping using any one or more of Ag, Co, Cu, B, H or Gd.

The high-heat threshold temperature can be a temperature selected from within the range of 40° C. to 100° C. Embodiments of the electrical power transmission line conductor can include magnetocaloric material configured to exhibit magnetocaloric effects to cause cooling of the electrical power transmission line conductor to regulate the operating temperature to within a range of 40° C. to 100° C. in ambient temperatures in the range of 30° C. to 60° C.

Another aspect of the present invention provides a method of electrical power transmission line conductor design comprising the steps of:
  determining an anticipated operating temperature range for the electrical power transmission line conductor, and select at least one of a low temperature threshold and a high temperature threshold;
  selecting one or more magnetocaloric materials exhibiting magnetocaloric effects around the selected low temperature threshold or high temperature threshold; and
  determining an arrangement for at least one electrical conductor, at least one strengthening structure and one or more magnetocaloric structures within a conductor bundle, the position of the magnetocaloric structures being selected to ensure the position magnetocaloric structures will coincide with the changing magnetic field generated by alternating current (AC) electrical power transmission via conductors in the bundle.

The step of selecting one or more magnetocaloric materials can include a step of tuning temperature for exhibition of the magnetocaloric effect to coincide with the selected low temperature threshold or high temperature threshold.

BRIEF DESCRIPTION OF THE DRAWINGS

An embodiment, incorporating all aspects of the invention, will now be described by way of example only with reference to the accompanying drawings in which.

DETAILED DESCRIPTION

Figure 1A:
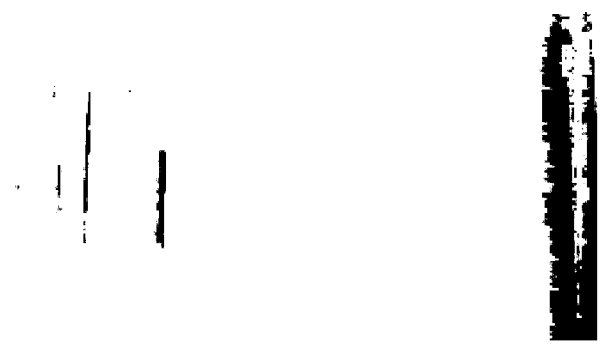
FIGS. 1a and 1b show some examples of the effects of icing on transmission lines.
Figure 1B:
Figure 2:
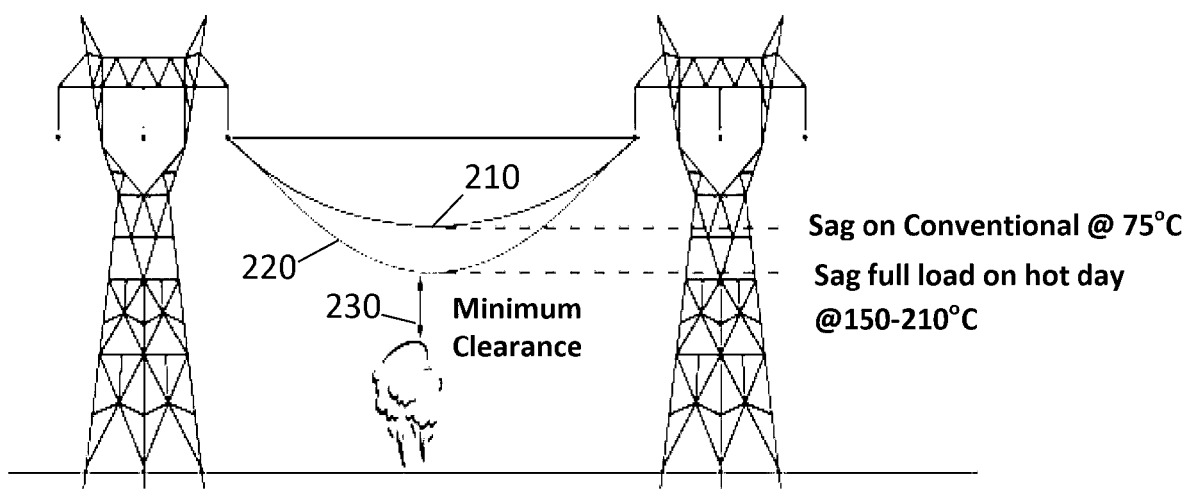
FIG. 2 illustrates the effect of sagging in extreme temperatures.

Magnetocaloric materials are types of materials which been discovered to exhibit a magneto-thermodynamic phenomenon in the presence of a changing magnetic field, this phenomenon is referred to as the magnetocaloric effect (MCE).

The magnetocaloric effect (MCE) is a magneto-thermodynamic phenomenon, whereby the temperature of materials (having magnetocaloric properties) can be manipulated by applying a changing magnetic field. For example, in an embodiment of a magnetocaloric material the temperature of the magnetocaloric materials increases with the heat generated by the variation of magnetic domain from a disordered state to an ordered state (magnetization) in response to application of a magnetic field. And when the magnetic field is removed the temperature decreases and the material absorbs heat due to the magnetic domain varying from an ordered state to a disordered state (demagnetization).

The present invention is an application of magnetocaloric effects to regulate the temperature of transmission lines. By incorporating magnetocaloric materials into electrical power transmission line conductor bundles, a changing magnetic field generated by high voltage alternating current electrical power transmission can cause magnetocaloric effects to regulate the operating temperature of the transmission lines, for example the effect of the changing magnetic field on the magnetocaloric material causing the magnetocaloric effect to generate heat to reduce icing, conversely a magnetocaloric material may have a magnetocaloric effect to cool the transmission lines in cases of extreme ambient heat.

Methods for regulating the temperature of transmission lines comprise incorporating magnetocaloric materials in the transmission line which exhibit magnetocaloric effects in response to the changing magnetic field generated by high power alternating current electric power transmission. The magnetocaloric materials can be selected to exhibit desired temperature regulation effects within ambient temperature ranges where high risk conditions tend to occur. For example, the magnetocaloric materials may be chosen to operate to warm the transmission line in typical icing temperatures, alternatively the magnetocaloric materials may be chosen to have a cooling effect in extreme heat conditions. Magnetocaloric materials of more than one composition may be used to enable both cooling and heating effects to be exhibited by one transmission line.

An embodiment of the invention provides an electrical power transmission line conductor bundles, the conductor bundles comprise at least one electrical conductor configured for transmission of high voltage alternating current electrical power, at least one strengthening structure bundled with the electrical conductor to provide physical support to the electrical conductor, and at least one magnetocaloric structure included in the bundle with the electrical conductor and strengthening structure. The magnetocaloric structure is configured to exhibit a magnetocaloric effect to regulate the operating temperature of the electrical power transmission line conductor in response to a changing magnetic field generated by transmission of high voltage alternating current electrical power via the at least one conductor.

The magnetocaloric effect (MCE) can operate to regulate the operating temperature of the electrical power transmission line conductor to maintain operating temperature above a range where icing occurs, below a high temperature threshold or within a target operating range.

The magnetic ordering temperature of the magnetocaloric materials can be tuned to exhibit a magnetic order transition within a working temperature range based on doping concentrations. Further first order magnetic phase transition magnetocaloric materials can be selected for enhanced heating performance by the addition of magnetic phase transition latent heat to maximize self-heating/cooling effects.

Advantageous embodiments of the invention provide applications of magneto-thermal technology for auto-climate controlled electric transmission lines through enhancing the magnetocaloric effects and also the thermodynamic efficiency of heating/cooling cycles of the materials, thus stabilizing the operation temperature to maintain operation in a designed range, for example, from 2° C. to 80° C. for prevention of the ice-clad formation in winter and sagging in summer. The operating temperature range may be designed in accordance with anticipated climactic conditions. For example, in some regions icing may not be of concern but over heating may be likely and thus only cooling magnetocaloric effects at high temperatures (say between 40° to 100° C. necessary), this cooling functionality serving to reduce sagging and potentially reduce inefficiencies in the electrical power transmission caused by high temperature operation. Typically the operating temperature of the transmission line will be higher than the ambient air temperature, for example due to the effects of sunshine on the transmission lines and heat resulting from the line resistance. So even though ambient temperatures may be in a high temperature range of around 30° C.-40° C. the transmission line may experience overheating conditions, for example above 80° C., due to additional heat generating factors (such as sunshine). In events such as bushfires ambient temperatures can exceed 150° C. It is therefore advantageous to consider cooling temperature regulation within wide ranges for ambient temperatures and operating temperatures.

Alternatively de-icing may be of particular interest and heating magnetocaloric effects desirable to maintain operating temperatures of the transmission lines between 0° C. to 5° C. for ambient temperatures in the range of 5° C. to −50° C.

To achieve magnetocaloric effects to maintain operating temperatures within target ranges particular attention is paid to the thermodynamic potential energy and kinetic processing of first order phase transition of the magnetocaloric materials. This includes the optimization of crystallographic/magnetic phase transitions, magneto-thermal behaviors during the magnetization process, equilibrium and non-equilibrium procedures, magnetic ordering, reversible and irreversible parameters, lattice strain, and anisotropy effects. This can enhance the thermodynamic cycling efficiency of the first order phase transformation in magnetocaloric materials, especially in response to alternating electro-magnetic field (AC field) conditions produced by high voltage alternating current electrical power transmission.

In an embodiment power line conductors are constructed using composite magnetocaloric materials with electrical conductor materials. In an embodiment this is achieved using powder-in-tube techniques (described in further detail below) for fabricating wires incorporating the magnetocaloric materials which can be bundled with electrical conductors and strengthening wires with minimal effect on mechanical properties on the resulting power line. The use of powder-in-tube technologies avoids hard forming problems for magnetic or magnetocaloric materials in this application. Further, embodiments of the invention allow various conductor designs with varying arrangements of the magnetocaloric materials to position these for maximum utilization of the self-field of the conductors, to maximize the magnetocaloric effects.

Fundamentals of Magnetocaloric Effects

Temperature control using a heating and cooling process is common in industrial applications. Conventional vapor-cycle heat transference is the most popular technique for industrial applications. In this technique, the heating can be realized by compressing a large volume refrigerant gas into a very small volume. The effect of compression transfers the system from the disordered state with large entropy to the ordered state with small entropy, thus releasing the heat. As the compressed gas is allowed to expand the system absorbs the heat for cooling. Similarly to vapor-cycle heat transference, magnetocaloric effect heat transference is based on changes in entropy in response to the system changing between disordered and ordered states. However, different from the vapor-cycle mechanism, the magnetocaloric effect utilizes the applied magnetic field to align the magnetic domains from the disordered state to ordered state for heating, and from the ordered state to the disordered state for cooling.

Figure 3:
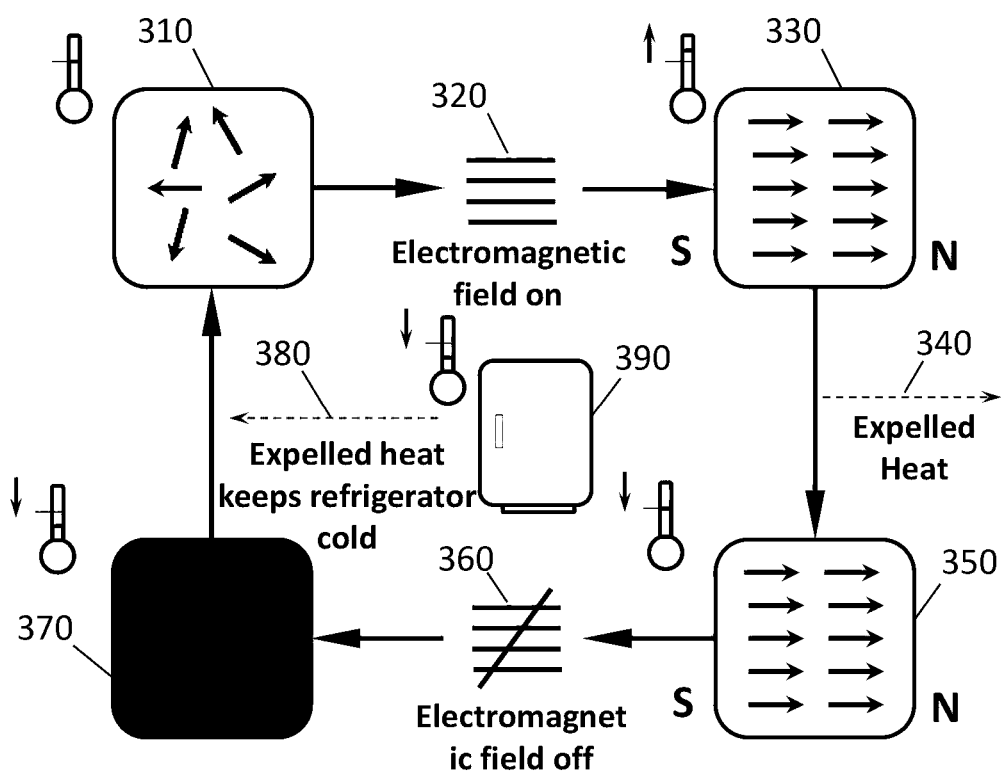
FIG. 3 illustrates the basic heating/cooling cycling principle of magnetocaloric effects.

FIG. 3 illustrates the basic heating/cooling cycling principle of magnetocaloric effects, using the example of a magnetocaloric refrigerator. Initially 310 the system is in a disordered state at the ambient temperature, without application of an electromagnetic field. In response to applying an electromagnetic field 320 the system transitions from disordered state to an ordered state 330 decreasing the entropy in the system causing heat which is released 340 from the magnetocaloric materials to the environment in an isothermal process, releasing heat to the surrounding area 350. When the electromagnetic field is turned off 360, then the system returns to the disordered state 370 increasing the entropy in the system in an adiabatic process, whereby heat is absorbed from a heat load 380 within the system, in the example of FIG. 3 from a refrigerator acting as a heat load.

In the magnetocaloric effect cycle, with an increase of applied electromagnetic field, the magnetic entropy decreases, and heat is released from the magnetocaloric materials to the environment in an isothermal process. With a decrease of applied field, the magnetic entropy increases, and heat is absorbed from the system to the magnetocaloric materials in an adiabatic process.

An isothermal process is a process that takes place at a constant temperature, and thereby to maintain the constant temperature heat must be released or gained from the outside environment. An adiabatic process is one that occurs within a system without the system losing or gaining energy.

Although magnetocaloric technology has been considered as a novel energy efficient and environmentally friendly technique to replace the current widely used vapor-cycle heat transferring technique, its usage is currently limited in the cooling applications, such as natural gas and hydrogen liquefiers, large-scale building air conditioner, refrigeration/freezer food processing plants, supermarket chillers, and high temperature superconductor electric device cryocoolers.

Considering refrigeration applications, a magneto-thermal system can be compact because the magnetic entropy density of a magnetic material is much larger than that of a refrigerant gas. The magnetic field for magneto-thermal can be provided by an electromagnet. Therefore, there is no need for compressors that have movable components, large rotational speed, mechanical vibration, noise, bad stability, and short working lifetime. It should be appreciated that the magneto-thermal heat exchanger componentry of the refrigerator may have no moving parts. The efficiency of magneto-thermal cycle can reach to 30-60% of the Carnot cycle while the efficiency of vapor compression refrigeration is only 5-10% of the Carnot cycle. Embodiments of the present invention take advantage of these characteristics of magneto-thermal systems to incorporate a magneto-thermal system into electric transmission lines to utilize magnetocaloric effect for regulating the operating temperature of electric transmission lines, for example to prevent icing and/or overheating.

In the refrigerant applications, the alternating magnetic field (AC Field) that aligns and misaligns the magnetic domains is normally generated by an electromagnet through powering the alternating electricity externally. However, in applications of the present invention an alternating electromagnetic field exists in the electric transmission lines carrying alternating current. Thus, the magneto-thermal system incorporated in the transmission line utilizes the magnetic field generated by virtue of the AC power transmission, rather than requiring an additional power supply or externally applied magnetic field. Thus, compared with other prior art de-icing technologies, the energy loss by using the magnetocaloric effects for the temperature controlling in the electric transmission lines is very limited.

Some materials have been shown to exhibit comparatively large magnetocaloric effects, these effects may also be referred to as "giant" or "colossal" magnetocaloric effects and the terms "large", "giant" and "colossal" are used to indicate different extents of large magnetocaloric effects in some contexts. The term giant is used throughout this description however, large or colossal may be interchangeably used. The effect is temperature dependent and an intrinsic property of the material related to structural entropy of the lattice structure of the material and, in particular, the magnetic order temperature for first order phase transition materials.

An embodiment of the present invention uses magnetocaloric effect materials (in some embodiments those referred to as giant magnetocaloric effect materials) with magnetic order temperature near the icing temperature within a target environment for installation of the transmission lines. For example, icing may occur in some environments from below temperatures of around 2° C., so it is therefore desirable to design transmission lines that will control the minimum operating temperature at 2° C. or above to inhibit formation of ice on the surface of electric transmission lines. The more efficient heating processing in magnetocaloric effect cycle at/below the icing temperature occurs in materials that possesses the magnetocaloric effect of first order phase transition materials. Such a process utilizes the heating of magnetic hysteresis and magnetic relaxing losses caused by the alternating electromagnetic field (AC field).

Alternatively, for cooling the overheated transmission lines at high temperature large magnetocaloric effects materials will be selected, for example, antiferromagnetic magnetocaloric materials with the transition temperature ($T_N$) near the over-heating temperature at 80° C. These materials start to absorb the heat at the temperature higher than $T_N$. Therefore, there is no energy loss and the magnetocaloric effect does not function at temperatures below $T_N$.

Dual-functions of heating and cooling can also be realized in the same transmission lines that are made utilizing a combination of magnetocaloric materials or composite materials exhibiting characteristics for both heating and cooling. For example, by using two different types of magnetocaloric materials in different wires included in a conductor bundle or incorporating two different types of magnetocaloric materials in the same wires in a bundle.

The efficiency of magnetocaloric effects for heating and cooling relies on the performance of the materials. Advantageous magnetocaloric materials having a large value of magnetic entropy ($\Delta S_m$) are being developed for application in transmission lines of the invention. Further manipulation of the compositions of the magnetocaloric materials can allow tuning of the magnetic ordering temperature and enhance the magnetocaloric effects in the developed material systems.

Evaluation of Magnetocaloric Effects

There are three measurement methods that can evaluate the magnetocaloric performance of the materials.

(1) The isothermal magnetization method: through measuring the magnetization (M) at different temperature (T) and under different field (B) and Maxwell equation to calculate the magnetic entropy changes ($\Delta S_m$).

(2) The iso-field heat capacity measurement method: through measuring the heat capacity (CB) at different temperature and field (B) and Maxwell equation to calculate the magnetic entropy changes ($\Delta S_h$).

(3) Direct measurement of the adiabatic temperature change ($\Delta T_{ad}$).

Current Development of Magnetocaloric Materials:

The change of entropy during the first-order phase transition is the fundamental principle of magnetocaloric effects. Recent advances in magnetocaloric materials have demonstrated that the entropy changes in MnAs (under a static pressure) and $Mn_{1-x}Fe_xAs$ (under ambient pressure) are much larger than the theoretical value, showing giant magnetocaloric effects. In addition, by comparing the magnetocaloric effects of $LaFe_{11.6}Si_{1.4}$, $La_{0.8}Nd_{0.2}Fe_{11.5}Si_{1.5}$, and $Ni_{43}Mn_{46}Sn_{11}$ in the vicinity of the first order phase transition, it was found that the measured $\Delta S_m = \Delta S_h$ in the materials of $LaFe_{11.6}Si_{1.4}$ and $La_{0.8}Nd_{0.2}Fe_{11.5}Si_{1.5}$ while for materials of $Ni_{43}Mn_{46}Sn_{11}$ the measured $\Delta S_m > \Delta S_h$. This demonstrates that $\Delta S_h$ presents the actual entropy of the first order phase transition in magnetocaloric materials, while $\Delta S_m$ is only suitable for the measurement of second order phase transition or the transition from paramagnetic to ferromagnetic. The inventors' work on $La_{0.7}Ca_{0.3}MnO_3$ materials verified the point that the measured $\Delta S_m = \Delta S_h$, since it dealt with a paramagnetic to ferromagnetic first order phase transformation material.

For cooling applications to magnetocaloric effect utilized is referred to as "inverse magnetocaloric effect" and in particular for transmission lines giant antiferromagnetic magnetocaloric materials which exhibit "Inverse magnetocaloric effect" are used where, the heating and cooling thermal cycling process is opposite to magnetocaloric thermal cycling. These types of materials are rare and materials currently known to be potentially suitable for cooling transmission lines include:

(1) $Ni_{0.50}Mn_{0.50-x}Sn_x$ $Ni_{0.50}Mn_{0.50-x}In_x$ and $Ni_{0.50}Mn_{0.50-x}Sb_x$ etc, alloys.

(2) Zn doped $Fe_3O_4$ etc. and (3) $LaCrO_3$ etc.

A challenge for developing temperature self-regulating transmission lines is that magnetocaloric materials typically have low magneto-thermal conversion efficiency and low thermal conductivity to disperse the heat. To develop the self-temperature controlling electric transmission lines, the requirements for suitable magnetocaloric materials include exhibiting satisfactory $T_C$ (Curie temperature), heating power potential and large magnetocaloric effects. Suitable materials may be identified through analysing the influential factors and calculating the efficiencies of magnetocaloric using different first order phase transformation magnetocaloric materials.

Figure 4:
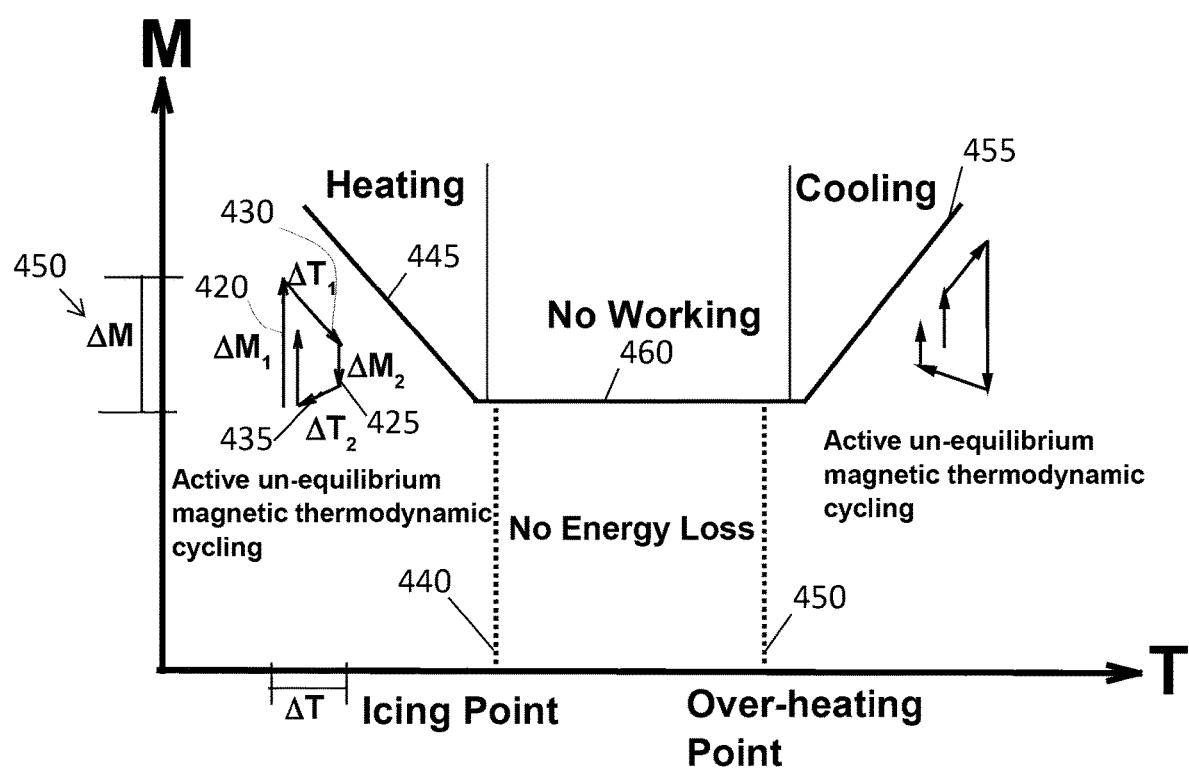
FIG. 4 illustration of the principle of magneto-thermal cycle heating/cooling under AC field for temperature-self-controlling transmission line conductors.
Figure 5A:
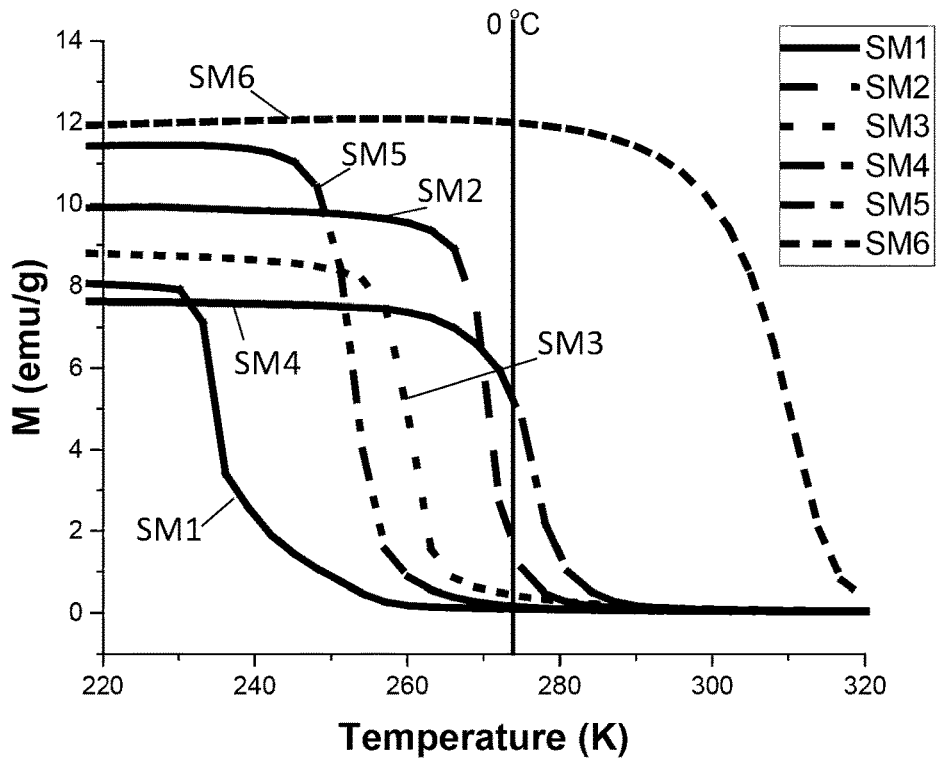
FIG. 5 Illustrates the $T_C$ tuning and magnetocaloric effects value of $La_{0.7}Ca_{0.3}MnO_3$
(a) the $T_C$ with Ca, Sr and Ag doped samples, such as $La_{0.7}Ca_{0.3}MnO_3$ (SM1), $La_{0.7}Ca_{0.27}Sr_{0.03}MnO_3$ (SM2), $La_{0.7}Ca_{0.25}Sr_{0.05}MnO_3$ (SM3), $La_{0.7}Ca0._{23}Sr_{0.07}MnO_3$ (SM4), $La_{0.7}Ca_{0.21}Sr_{0.06}Ag_{0.03}MnO_3$ (SM5), $La_{0.7}Ca_{0.2}Sr_{0.1}MnO_3$ (SM6);
(b) magnetic entropy change ($-\Delta S_m$) of sample SM2 as a function of temperature for different magnetic field intervals;
(c) the temperature dependence of the magnetization for $(Mn_{1-x}Ni_x)_3Sn_2$ materials for selected samples x=0 to 0.5 during field cooling, which shows the $T_C$ tunings; and
(d) the temperature dependence of the $-\Delta S_m$, for $(Mn_{1-x}Ni_x)_3$ $Sn_2$ material x=0 and 1.0 samples in magnetic field changes $\Delta H$ up to 5 T.
Figure 5B:
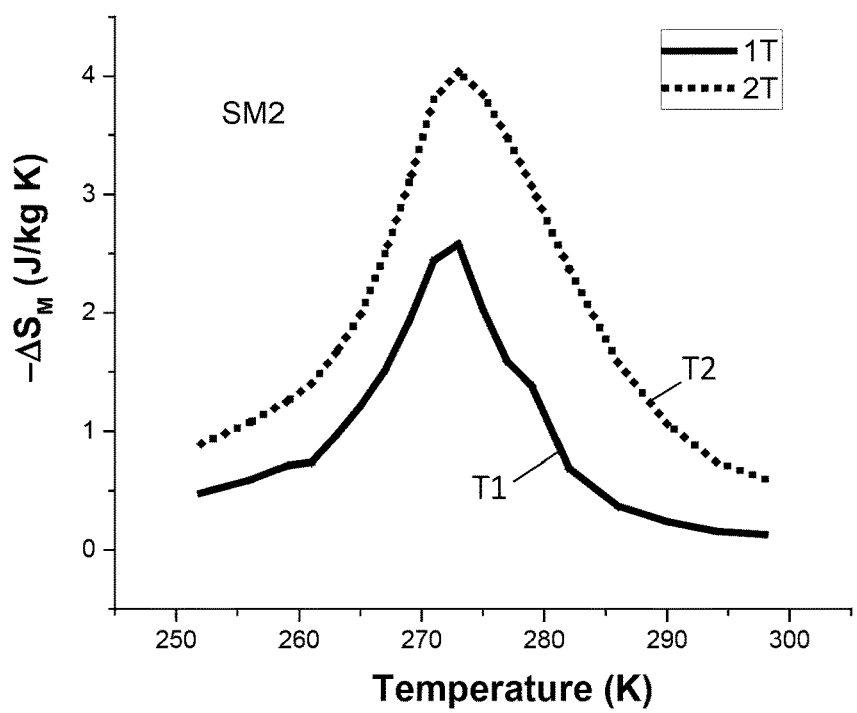
Figure 5C:
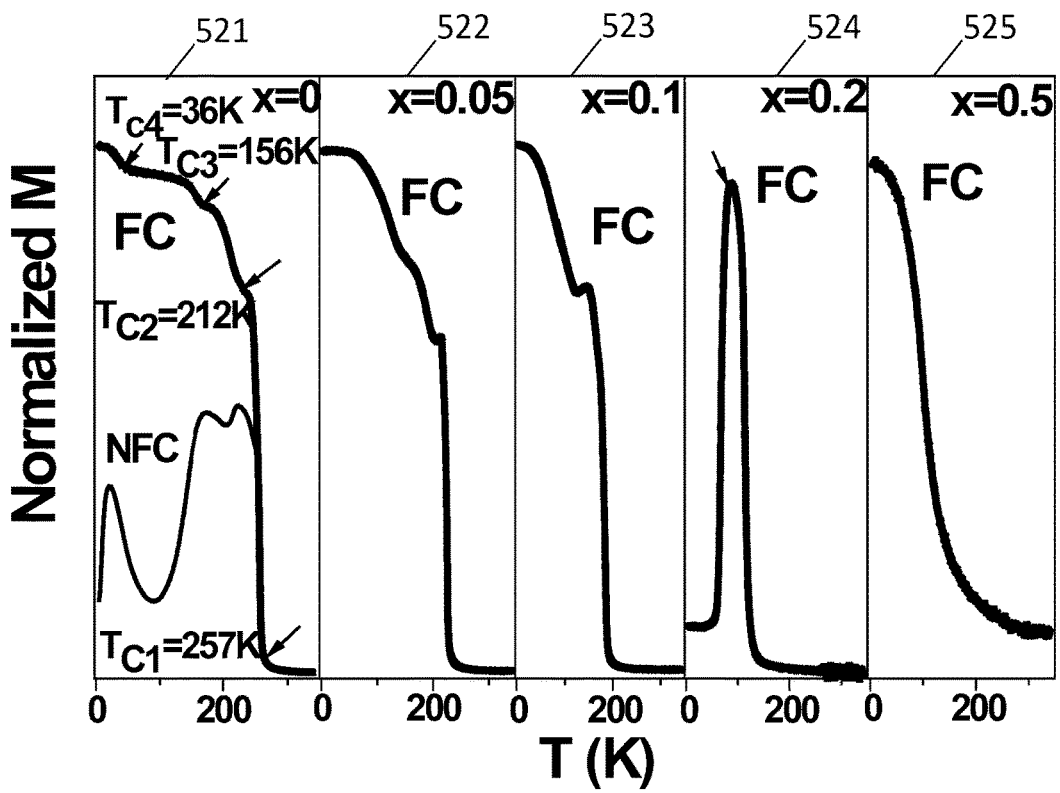
Figure 5D:
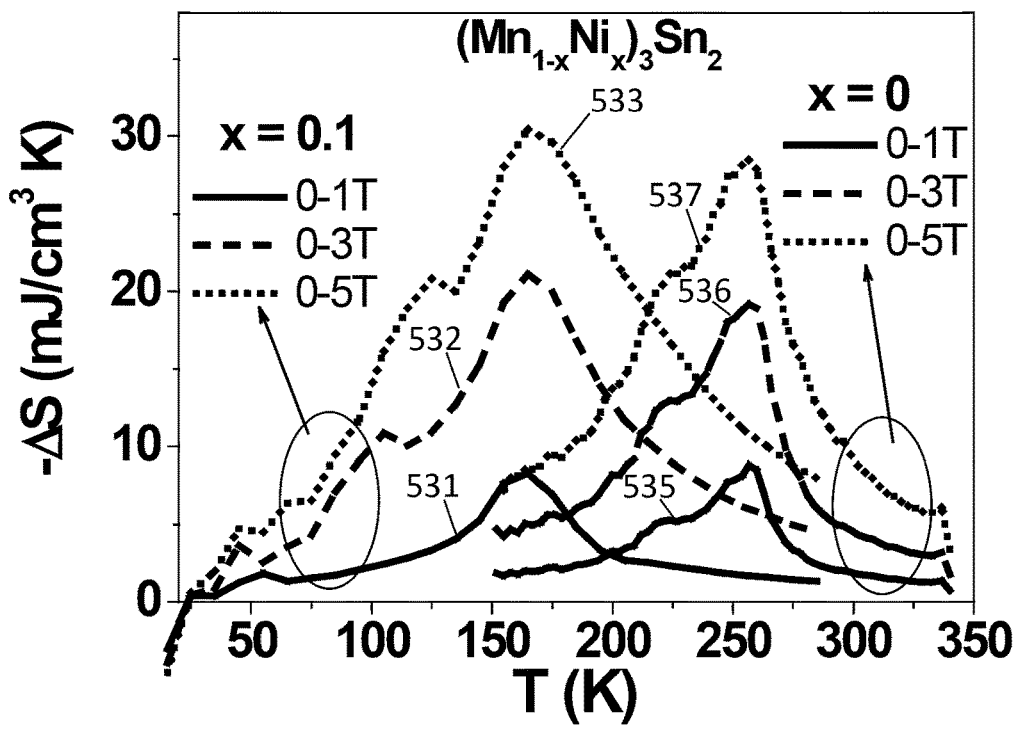

In the application for smart electric transmission line, the magnetocaloric materials undertake an active un-equilibrium magnetic thermodynamic cycle under the applied AC field as shown in FIG. 4. Explained simply, in low temperature conditions the magnetocaloric materials are selected which, due to the giant magnetocaloric effect, cause a greater increase in temperature $\Delta T_1$ in the system in response to increase in magnetisation $\Delta M_1$, than the decrease in temperature $\Delta T_2$ in response to decreasing magnetisation $\Delta M_2$. Further in the overheating range the magnetocaloric materials are selected which exhibit properties which cause a greater decrease in temperature than increase in the magnetic thermodynamic cycle.

A challenge is to select and tune materials to adjust the transition temperatures of the magnetocaloric materials in the transmission lines to operate without magnetocaloric effects 460 within a range between the icing point 440 and over-heating point 450, in combination with, within the icing range 445 and/or overheating range 455, achieve the large magnetocaloric effects, for example, to achieve a large change in magnetisation $\Delta M$ 410 or a large difference value of $\Delta M_1 - \Delta M_2$ 420, 425, which is directly related the value of $\Delta T_1 - \Delta T_2$ 430, 435 as shown in FIG. 4. It is desirable to determine an effective composite of the magnetocaloric materials for balance the heating and cooling power, and to optimize the design of transmission line conductors. For example, to maximize the magnetocaloric effects under high AC magnetic field, to increase efficiency of the magnetocaloric effect as a property of the material within the magnetic field for the typical operating range for electricity transmission lines, for example from 10 A to 10,000 A or more.

The inventors have investigated a large range of magnetocaloric materials to enable selection of suitable magnetocaloric materials (depend on the transition temperature, MCE efficiency, the manufacturing cost) for the application in transmission lines. The evidence of $T_C$ tuning and magnetocaloric effects is shown in FIG. 5.

The graphs in FIG. 5 illustrate examples of manipulation of material properties on magnetocaloric effects, in particular using doping technology to tune the material characteristics. FIG. 5a shows results of the effect of doping of $LaMnO_3$ using Ca, Sr and Ag doping on the magnetic phase transition temperature. This demonstrates how the magnetic phase transition temperature may be adjusted using doping. The presented test results demonstrate a magnetic transition at approximately 2° C. for materials with atomic stoichiometry ratio of SM2 and SM4, indicating suitability of these materials for application in for anti-icing application in electricity transmission lines. Transition temperatures above zero Celsius degree have also been achieved for Co and Gd doped $LaMnO_3$ materials. FIG. 5(b) shows magnetic entropy change ($-\Delta S_m$) of $La_{0.7}Ca_{0.23}Sr_{0.07}MnO_3$ (SM4) as a function of temperature for different magnetic field intervals. The inventors have also investigated the effects of anisotropy and strain on the magnetic phase transition and magnetocaloric properties in bulk and single crystals of $LaMnO_3$. For $(Mn_{1-x}Ni_x)_3Sn_2$ materials, FIG. 5(c) also illustrates results for $Mn_3Sn_2$ with Ni doping, showing the temperature dependence of the magnetization for selected samples having x=0 to 0.5 during field cooling, which shows the $T_C$ tunings. FIG. 5(d) shows the temperature dependence of the $-\Delta S_m$ of $(Mn_{1-x}Ni_x)_3Sn_2$ materials with x=0 and 1.0 samples in magnetic field changes $\Delta H$ up to 5 Tesla. These results demonstrate the ability to adjust the material properties to control the magnetocaloric effect and thereby enable magnetocaloric materials to be produced to exhibit predictable magnetocaloric effects in the target operating environment.

The inventors have also discovered that magnetic phase transition temperature $T_m$ does not equal the crystal structure transition temperature $T_{st}$ in an MnCoGe system. Embodiments of the invention approach tuning the two transition temperatures by adjusting $T_m$ or $T_{st}$ closer to each other in order to further enhance magnetocaloric effects. B, H, Gd, and Cu interstitial doping and substitution on La, Fe, or Si sites for $La(FeSi)_{13}$ has been shown to significantly reduced the hysteresis loss of $La(FeSi)_{13}$. These discoveries provide insights into the fundamental principle to develop the new magnetocaloric materials for the application of auto-climate controlled electric transmission lines.

Investigations into materials with the significant improvement of magneto-thermal effects in the optimized materials systems are now key aspects of research into advanced magnetocaloric materials. An understanding of magneto-thermal phenomenon in new materials can provide a means to incorporate good magnetic properties with efficient thermodynamic cycle and result in improved magneto-thermal performance. Such improvement could be achieved through evaluating the magneto-thermal efficiency of first order phase transformation materials. Future progress in the magneto-thermal effects for the applications of auto-climate controllable electric transmission lines will be largely driven by advances in materials.

Utilising magnetocaloric materials enables design and development of composite materials that can have the functionalities of heating and cooling at the set temperatures to realize the auto-climate control of electric transmission lines. This approach can enable the functionalities of anti-icing and sagging prevention (cooling) in the transmission lines. This cannot be achieved efficiently using current prior art technologies.

Fabrication of Auto-Climate Controlled Electric Transmission Lines

Figure 6:
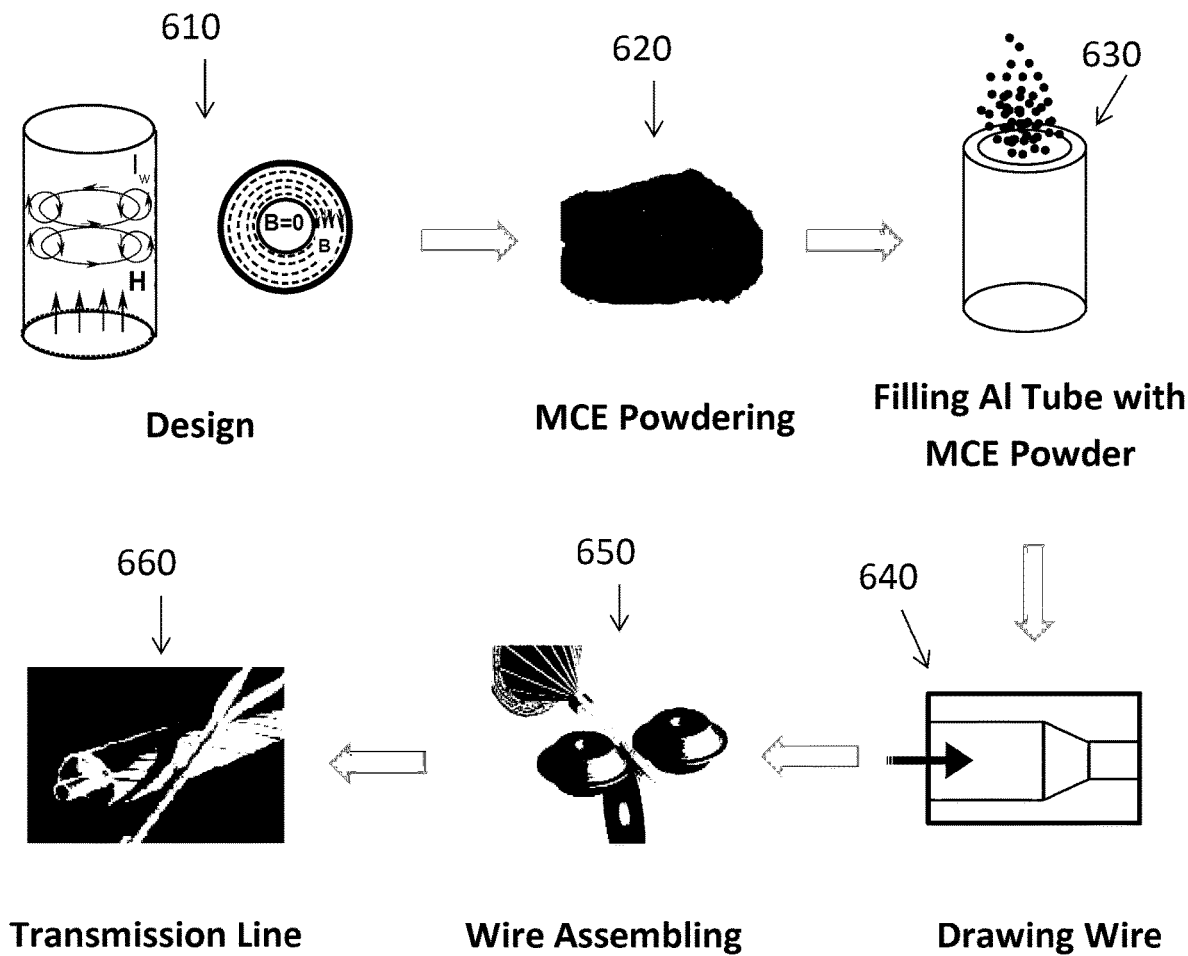
FIG. 6 illustrates a process for fabricating an electric power conductor in accordance with an embodiment of the present invention.

An aspect of the invention is fabrication of wires having a metal cladded (e.g. an aluminium cladded) magnetocaloric materials core or multi-filament cores using powder-in-tube technology. For example, such wires may be used within the outmost layer or internally within a conductor bundle of the transmission lines to act as a main component for auto-climate control. An example of a fabrication process is illustrated in FIG. 6, first the electrical conductor is designed and it is envisaged that the conductor design will be based on known techniques such as aluminium conductor steel reinforced (ACSR) and all-aluminium alloy conductor (AAAC) techniques bundling strengthening wires around conductive core wires, and composite core conductors such as ACCR and ACCC where the strengthening structure is a conductor core, for example carbon and glass fibre core, and the wires for carrying the electrical power are bundled around the supportive core.

Each of these design techniques can be modified to include components incorporating magnetocaloric materials. A preferred method of incorporation of the magnetocaloric materials into transmission lines is using Powder-in-Tube Technology to produce wires incorporating the magnetocaloric materials which can be bundled with one or more electrical conductors and support structure.

The magnetocaloric materials for the transmission line can be selected and optionally tuned using techniques described in further detail below. The arrangement for the magnetocaloric structures within the transmission line conductor is then designed. In particular the position for the magnetocaloric structures within the conductor bundle can be selected to ensure the position magnetocaloric structures will coincide with the AC magnetic field generated by AC electrical power transmission via conductors in the bundle. Further the selection of position for the magnetocaloric structures can be influenced by heat transfer characteristics of the elements (electrical conductors and strengthening structures) in the bundle, to maximise isothermal heat transfer between the magnetocaloric structures and other elements within the bundle. An example of a fabrication process is shown in FIG. 6, and the step of designing the electrical conductor bundle structure is illustrated as step 610.

An example of a transmission line fabrication process using powder-in-tube techniques starts with fabrication of first order phase transformation materials, examples include alloys, such as $RMnO_3$ and Zn doped $Fe_3O_4$ compounds. The alloy can be made with element ingots while the $RMnO_3$ and Zn doped $Fe_3O_4$ will be synthesized through solid state reaction. The material can be processed to produce a powder, step 620 of FIG. 6. Subsequently, the as-prepared heating materials [e.g. $(Mn_{1-x}Ni_x)_3Sn_2$, $RMnO_3$] or cooling materials (Zn doped $Fe_3O_4$) will be filled and sealed into aluminium tubes (630). In an example wires have been fabricated using aluminium tubes (purity >99.6%) with the following dimensions: outside diameters of 8 mm, inside diameters of 4 mm. By using the powder-in-tube methodology, the aluminium tubes will be drawn into thin wires 640, using multiple steps of drawing through a set of drawing dies (for example, with the deformation ratio of 12%) and interval annealing processing (for example, annealed the as-drawn materials at 375° for 10 to 30 minutes every two passes). The wires are then bundled using a conventional wire assembling process 650 to form a transmission line conductor bundle 660. For example, this can produce a kilometre long wire with aluminium clad ceramic cores as schematically illustrated in FIG. 6. A testing example used 12 aluminium tubes with length of 2.0 meter to produce 12 aluminium clad ceramic (magnetocaloric material) core wires with a diameter of 3.07 mm and length of 1358 mm, these magnetocaloric wires were used as heating elements to replace 12 aluminium wires in the outmost shell of the cable, which consists of 54 aluminium wires with 7 steel core wires (reinforce) for de-icing testing with an electrical current of 540 A.

There are two approaches that can achieve the dual functions of heating and cooling in the transmission lines. A first approach is to prepare a magnetocaloric material comprising a combination of materials having desired heating and cooling characteristics and use this combined material in the magnetocaloric structure. For example, put the mixture of $RMnO_3$ and Zn doped $Fe_3O_4$ into an aluminium tube to produce the composite transmission lines. A second approach is to prepare separate magnetocaloric structures for cooling and heating and include both types of structures within the conductor bundle. For example, mix $RMnO_3$/Al wires and Zn doped $Fe_3O_4$ wires in a bundle of pure aluminium wires to form the transmission lines. For the first approach, the fabrication cost may be lower but the difference of resistivity and thermal expansion coefficient between $RMnO_3$ and Zn doped $Fe_3O_4$ may degrade the temperature regulation performance of the transmission lines compared to the second approach.

The magnetic field and temperature dependence of specific heat exchange in the fabricated transmission lines can be tested in the temperature arrange from −50° C. to 150° C. to confirm the performance in a laboratory or test environment. For example, using a fridge and oven to test the capability of anti-icing and sagging of the transmission line conductor. In the anti-sagging experiment, a weight can be hung in the middle of the wire to act as the tensile force on the wires during the heating. Experimental data can be used to inform and optimise industrial production of the transmission line conductors.

As discussed above the selection and development of magnetocaloric compositions to exhibit magnetocaloric effects in the target operating temperature ranges only is advantageous for the efficiency of temperature self-regulating power transmission lines. The inventors have performed significant research correlating the size of magnetocaloric crystals, defects, dopants and processing technique with magneto-thermal conversion efficiency and operation temperature to optimize the materials. This enables assessment of the full potential and also the fundamental limit of the materials for the applications of anti-icing and anti-sagging (cooling) of the electric transmission lines. A methodology to evaluate the magnetocaloric effects through examining the existing measurement systems of magnetocaloric entropy has also been developed. This establishes a universal measurement standard to address the key problems of fundamental research in the applications of magnetocaloric effects and provide guidance to improve the magneto-thermal conversion efficiency significantly.

Understanding the Phenomenon of Magnetocaloric Effects, Assessing its Potential and Limitation Magnetocaloric Effects with Experimental Procedure: In general, the latent heat exchange is very large at the magnetic phase transition temperature of a magnetocaloric material. The magnetocaloric effect decreases when the temperature deviates from the phase transition temperature. In this case, the magnitude of magnetocaloric effects can be determined with both molecular field approximation calculations and experimental measurements. Direct magnetocaloric measurements of magnetic entropy change ($\Delta T_{ad}$) can be conducted using traditional methods with a sensor in thermal contact on the sample. Indirect measurements can be implemented by the calculation with Maxwell relationship using experimental data of isothermal magnetization and field-dependent heat capacity.

Comparing the theoretical magnetic entropy change ($\Delta S_{theory}$) of magnetocaloric materials, regardless of the measurement methodology, such as $\Delta S_m$, $\Delta S_h$, and $\Delta T_{ad}$, all are smaller than $\Delta S_{theory}$ for the second order phase transition magnetocaloric materials and even for the first order phase transition giant magnetocaloric materials.

In the giant magnetocaloric materials (under external pressure and internal doping chemical pressure), the measured magnetic entropy of $\Delta S_m$ is larger than the theoretical magnetic entropy of $\Delta S_{theory}$, having $\Delta S_m > \Delta S_{theory}$. However, the results of magnetic entropy changes in colossal magnetocaloric materials measured with the other methodologies of $\Delta S_h$ and $\Delta T_{ad}$ are not available yet. Therefore, it is essential to evaluate and compare the magnetic entropy change measured by $\Delta S_m$, $\Delta S_h$, and $\Delta T_{ad}$ for the colossal MCE materials before developing the magnetocaloric materials for the application of auto-climate controllable electric transmission lines. In fact, each method has natural limitations, therefore presenting two problems: (1) how to identify and analyze the actual magnetocaloric effects of the first order phase transformation materials; and (2) how to fully utilize the magnetocaloric effects of the first order phase transformation materials in magnetic thermodynamic cycling.

When dealing with itinerant magnetic materials, the assumption on the field independence of lattice and electronic contributions is only valid if the electron-phonon interaction is very small. However, the field independence of the electronic and the lattice terms is usually adopted in practice for all materials. Consequently, it is also usually accepted that the upper limit for the molar entropy variation is given by the magnetic contribution: $\Delta S_{theory} = \Delta S^{max}_M = R\ln(2J+1)$, where R is the gas constant and J is the total angular momentum of the magnetic ion. J can be surpassed when a system undergoes a first order transition when the entropy variation of the system is dominated by the latent heat of the transition. In order to establish a universal evaluation system to determine the actual magnetocaloric effects, it is necessary to physically consider the contributions from the types of magnetic states, magnetic and thermal hysteresis, anisotropy and lattice strain, thermodynamic and kinetic processing, etc. Their contributions can be revealed trough the following materials characterization.

Materials Characterization

The thermophysical properties, including magnetic properties, heat capacity, and heat conductivity can be measured by an extensive suite of instruments, such as physical and magnetic properties measurement systems (PPMS and MPMS), and a vibrating sample magnetometer (VSM). In particular, the magnetic field dependence of heat capacity as a function of temperature at the first order phase transformation of the magnetocaloric materials can be measured with the heat capacity probe attached in a 14 Tesla PPMS system. Differential Scanning calorimetry (DSC) and Laser flash analysis can also be used to measure the specific heat and thermal diffusivity of the magnetocaloric materials in an ambient environment. X-ray diffraction (XRD), energy dispersive X-ray spectroscopy (EDX), scanning electron microscopy (SEM), transmission electron microscopy (TEM), and high resolution TEM (HRTEM) can be employed to characterize the crystallographic structures, and compositions of prepared materials.

Size Dependence of Physical Properties in Magnetocaloric Materials

The physical property and performance of magnetocaloric materials including the phase transformation temperature (PT), magnetization (M), magnetic entropy changes and power capacity of heat/cooling cycles is highly dependent on the grain and particle size of magnetocaloric powders. The inventors have shown that, particularly, for particles in nanoscale dimensions PT decreases as the particle size decreases. The peak value of $\Delta S_M$ will also decrease with the particle size but the peak temperature range will be broadened. Therefore, the power capacity of heating/cooling increases. For the application of magnetocaloric effects on the auto-climate controlled electric transmission lines, we need to have a higher PT with large power capacity. This makes the optimization of magnetocaloric materials challenging, and understanding the size dependent physical properties of this material system is essential. For example, a rapid sol-precipitation technique may be used to produce high quality and large scale yield of magnetocaloric powders with various sizes, alternatively ball milling may be used to physically divide the oxide materials into ultra-fine particles. The size can be controlled by manipulating the milling time. Through measuring the physical properties of the materials, a road map of size effects on the magnetocaloric effects can be established to optimize the materials, which have large power capacity at the desired set temperature.

Figure 13:
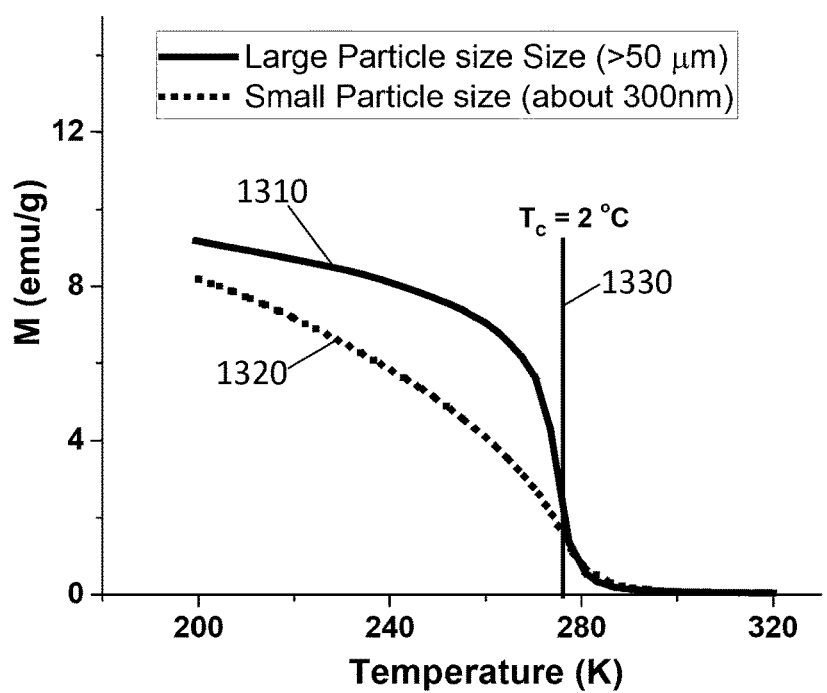
FIG. 13 illustrates a comparison of temperature dependence of magnetization in the applied magnetic field at 100 Oe for samples of $La_{0.7}Ca_{0.254}Sr_{0.046}MnO_3$ (SM9) having two different particle sizes.
Figure 14A:
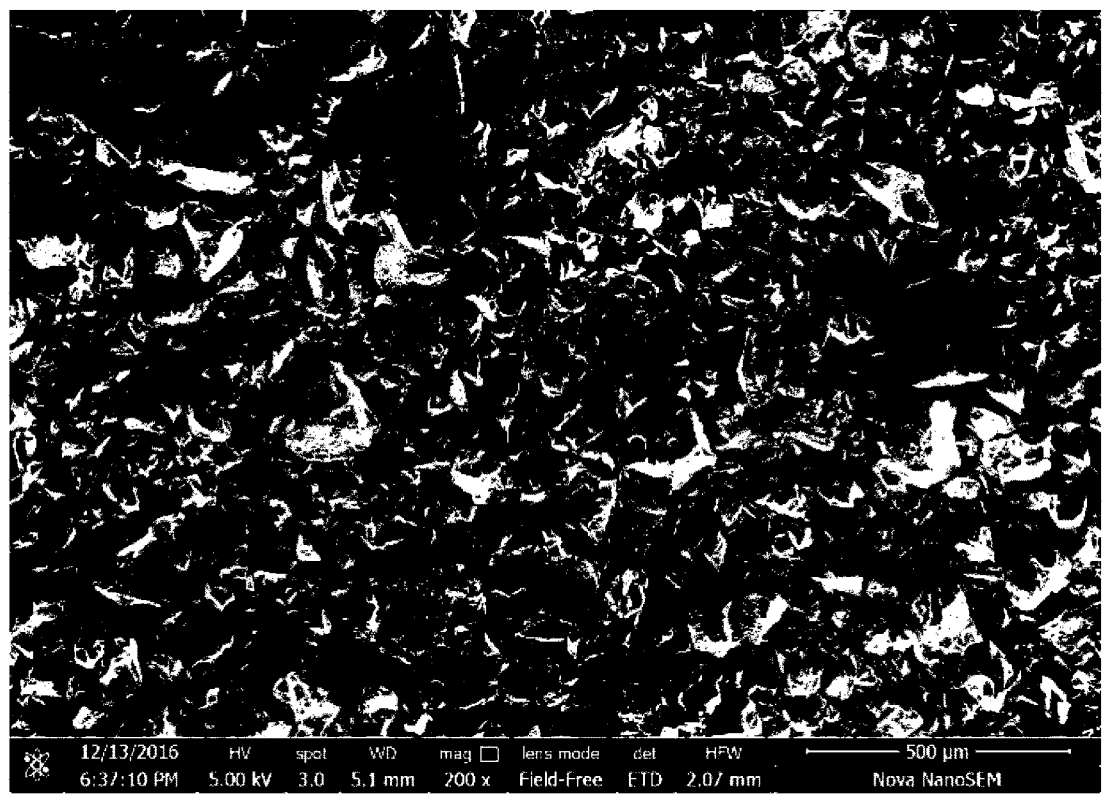
FIG. 14a shows the morphology of a sample of $La_{0.7}Ca_{0.254}Sr_{0.046}MnO_3$ (SM9) having a particle size of >50 µm.
Figure 14B:
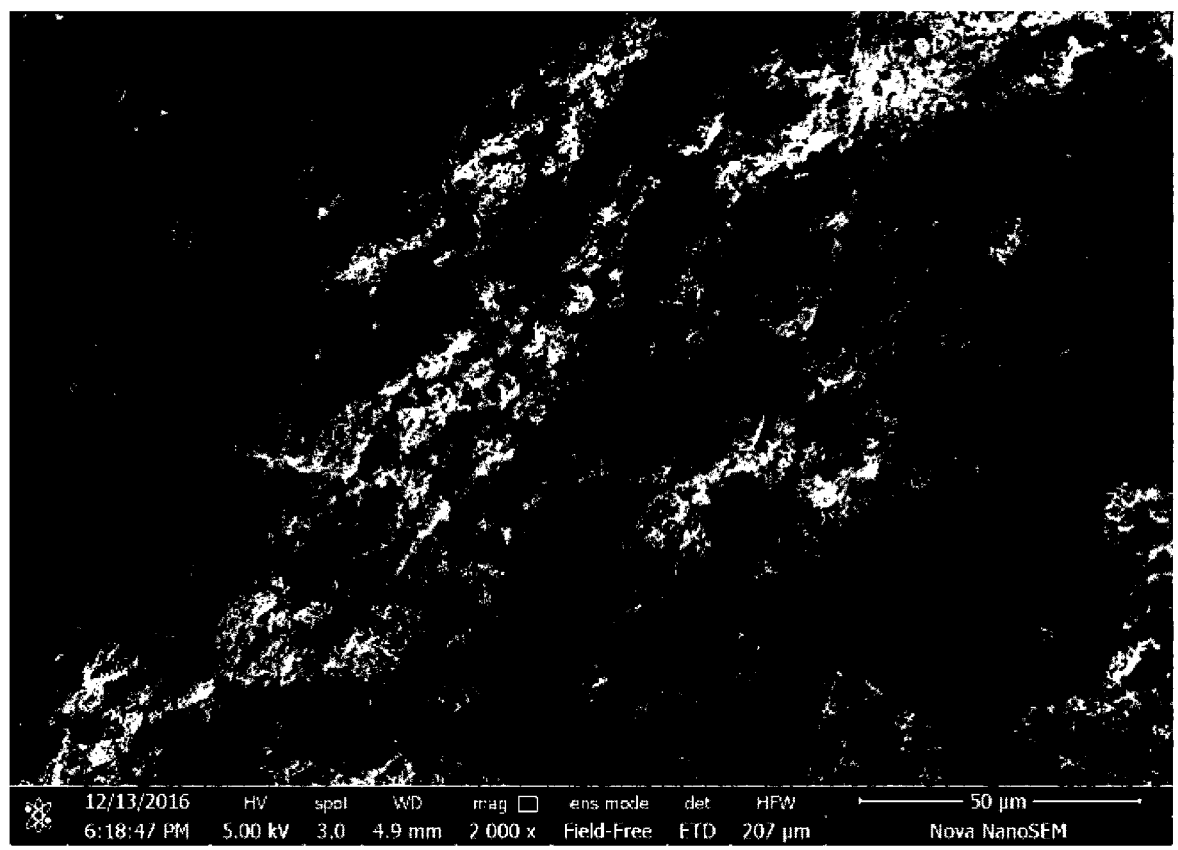
FIG. 14b shows the morphology of a sample of $La_{0.7}Ca_{0.254}Sr_{0.046}MnO_3$ (SM9) having a particle size of 258∓6 nm.

Particle size also influences the flowing characteristics of the particles during the drawing process. Coarse particles (for example hand grinded materials) exhibit poor flowing properties. This can cause problems during wire fabrication, such as breakage of the wires easily during the wire drawing. However, such fabrication problems can be improved significantly by using fine powders exhibiting better flowing properties. In an example magnetocaloric materials were prepared using a RETSCH™ planetary Ball Mill PM 400 system with Tungsten Carbide milling media and milled at a speed of 300 rpm for 2 hours. IN this example the material initially had an average particle size of greater than 50 μm produced by hand grinding, and the particle size was reduced using ball milling to a particle size of around 258 nm. Testing by the inventors indicated that the first order magnetic phase transition temperature ($T_C$) of the material processed using this technique was not changed from its counterpart in micrometre scale, as shown in FIG. 13. FIG.

13 shows the temperature dependence of magnetization at 100 Oe for the samples of $La_{0.7}Ca_{0.254}Sr_{0.046}Ag_{0.03}MnO_3$ (SM10) having average particle sizes of >50 um and 258.8±6.00 nm. FIG. 13 shows that the phase transition temperature 1330 is the same for both samples, one having an average particle size of >50 μm 1310 and the other having a particle size of 258.8±6.0 nm 1320, respectively.

Optimization of Composition for Temperature Regulating Electric Transmission Lines For the first order phase transformation, the magnetic transition from antiferromagnetic to ferromagnetic will result in heat release; vice versa will cause heat absorption. The inventors have demonstrated heating effects at the set temperature for de-icing and anti-icing. At the time of writing development is ongoing for materials for cooling at the set temperature of 80° C. Zn-doped $Fe_3O_4$ shows the first order phase transformation from antiferromagnetism to ferromagnetism with increase of temperature. In these materials, the non-magnetic $Zn^{2+}$ is used to substitute the magnetic $Fe^{2+}$. The direction of the magnetic moment is opposite to that of $Fe^{3+}$, in spinel structure. Similar radii of these two ions ($Zn^{2+}$—0.074 nm and $Fe^{2+}$—0.077 nm) make the doping process easier to realize. Higher level of Zn doping will result in higher antiferromagnetism and higher transition temperature but will also induce some extent of magnetostriction to impede the rotation of magnetic domains.

In order to realize the cooling effects at the set temperature, the antiferromagnetic/ferromagnetic transition temperature can be increased by increasing the doping level of Zn. However, it is desirable to reduce the magnetostriction to minimize its effects on magneto-thermal efficiency. The Zn doping level dependence of magnetocaloric properties can be investigated to optimize the materials. The physical properties of the magnetocaloric materials can be correlated with the Zn doping level to optimize the performance of this materials system for the anti-sagging application of electric transmission lines.

It is apparent that the development of new materials will continue to be a major part of development this technology, which is expected to bring not only incremental improvements over conventional electric transmission lines in national grids, such as significantly reducing the maintenance and replacement costs as well as severe working condition and safety of the technical officers, but also new functionalities such as large saving in power and realizing automatic temperature control. Embodiments of the invention provide potential for reducing risk of power loss or catastrophic damage to power transmission infrastructure during extreme weather events. In addition to the economic advantages, reducing risk of power loss also has a significant health and safety advantage, for example reducing the risks of death or illness attributed to loss of power (causing loss of heating or cooling and limiting hospital operability) during extreme weather events.

APPENDIX 1

Overview of Underlying Technologies and Magnetocaloric Effects

Gibbs Free Energy

The greatest amount of mechanical work which can be obtained from a given quantity of a certain substance in a given initial state, without increasing its total volume or allowing heat to pass to or from external bodies, except such as at the close of the process are left in their initial condition. Technically, the Gibbs free energy is the maximum amount of non-expansion work which can be extracted from a closed system or this maximum can be attained only in a completely reversible process.

The thermodynamic properties of a system are fully determined by the Gibbs free energy or free enthalpy of the system. The system we consider here consists of a magnetic material in a magnetic field B at a temperature T under a pressure p. The Gibbs free energy G of the system is given by $$G = U - TS + pV - MB \tag{1}$$

Where U is the internal energy of the system, S the entropy of the system, and M the magnetization of the magnetic material. The volume V, magnetization M, and entropy S of the material are given by the first derivatives of the Gibbs free energy as follows:

$$V(T, B, p) = -\left(\frac{\delta G}{\delta p}\right)_{T,B} \tag{2}$$

$$M(T, B, p) = -\delta G \delta BT, p$$

$$S(T, B, p) = -\left(\frac{\delta G}{\delta T}\right)_{B,p}$$

The specific heat of the material is given by the second derivative of the Gibbs free energy with respect to temperature $$c_p(T, B) = -T\left(\frac{\delta^2 G}{\delta T^2}\right)_p \tag{3}$$

By definition, if the first derivative of the Gibbs free energy is discontinuous at the phase transition, then the phase transition is of the first order. Therefore, the volume, magnetization, and entropy of the magnetic material are discontinuous at a first-order phase transition. If the first derivative of the Gibbs free energy is continuous at the phase transition but the second derivative is discontinuous, then the phase transition is of second order.

Magnetic Entropy

Entropy measures the spontaneous dispersal of energy; how much energy is spread out in a process or how widely spread out it becomes—at a specific temperature. It also describes the tendency for systems to go from a state of higher organization to a state of lowest organization on a molecular level. In physics, entropy is a mathematical measurement of a change from greater to lesser potential energy related to the second law of thermodynamics.

The total entropy of a magnetic material in which the magnetism is due to localized magnetic moments is presented by $$S(T,B,p) = S_l(T,B,p) + S_e(T,B,p) + S_M(T,B,p) \tag{4}$$

Where $S_l$ represents the entropy of the lattice subsystem, $S_e$ the entropy of conduction-electron subsystem and $S_M$ the magnetic entropy, i.e. the entropy of the subsystem of the magnetic moments. In magnetic solids exhibiting itinerant-electron magnetism, separation of these three contributions to the total entropy is, in general, not straightforward because the 3 d electrons (referring to the 3 d electron orbital) give rise to the itinerant-electron magnetism, and also participate in the conduction. Separation of the lattice entropy is possible only if electron-phonon interaction is not taken into account.

Since the entropy is a state function, the full differential of the total entropy of a closed system is given by $$dS = \left(\frac{\delta S}{\delta T}\right)_{p,B} dT + \left(\frac{\delta S}{\delta p}\right)_{T,B} dp + \left(\frac{\delta S}{\delta B}\right)_{T,p} dB \quad (5)$$

Among these three contributions, the magnetic entropy is strongly field dependent and the electron and lattice entropies are much less field dependent.

Therefore, for an isobaric-isothermal (dp=0; dT=0) process, the differential of the total entropy can be represented by $$dS = \left(\frac{\delta S_M}{\delta B}\right)_{T,p} dB \quad (6)$$

For a field change from the initial field $B_i$ to the final field $B_f$, integration of Eq. (6) yields for the total entropy change $$\Delta S(T,\Delta B) = S(T,B_f) - S(T,B_i) = \Delta S_M(T,\Delta B) \quad (7)$$

Where $\Delta B = B_f - B_i$. This means that the isothermal-isobaric total entropy change of a magnetic material in response to a field change $\Delta B$ is also presented by the isothermal-isobaric magnetic-entropy change.

The magnetic-entropy change is related to the bulk magnetization, the magnetic field and the temperature through the Maxwell relation $$\left(\frac{\delta S_M(T,B)}{\delta B}\right)_{T,p} = \left(\frac{\delta M(T,B)}{\delta T}\right)_{B,p} \quad (8)$$

Integration yields $$\Delta S_M(T,\Delta B) = \int_{B_i}^{B_f} \left(\frac{\delta M(T,B)}{\delta T}\right)_{B,p} dB \quad (9)$$

On the other hand, according to the second law of thermodynamics $$\left(\frac{dS}{dT}\right)_{B,p} = \frac{c_p(T,B)}{T} \quad (10)$$

Integration yields $$S(T,B) = S_0 + \int_0^T \frac{c_p(T',B))}{T'} dT' \quad (11)$$

In the absence of configuration entropy, the entropy will be zero at T=0 K, so that the value of $S_0$ is usually chosen to be zero. Therefore, the entropy change in response to a field change $\Delta B$ is given by $$\Delta S(T,\Delta B) = \int_0^T \frac{c_p(T',B_f) - c_p(T',B_i)}{T'} dT' \quad (12)$$

Where $c_p(T',B_f)$ and $c_p(T',B_i)$ represent the specific heat at constant pressure p and in the magnetic field $B_f$ and $B_i$ respectively.

Determination of the Magnetocaloric Effect from Specific-Heat Measurements

Specific-heat measurement is the most accurate method of determining heat effects in a material. The total entropy change of a magnetic material can be derived from the specific heat by using Eq. (12). According to Eq. (7), this entropy change is equal to the magnetic-entropy change for an isobaric-isothermal process. This means we can also obtain the magnetic-entropy change from the field dependence of the specific-heat measurements by using Eq. (12).

The determination of the absolute value of the adiabatic temperature change in different magnetic materials is a rather complicated task. Combining the Equations. (6), (8) and (10), the infinitesimal adiabatic temperature change for the adiabatic-isobaric process is found to be $$dT(T,B) = -\frac{T}{c_p(T,B)} \left(\frac{dM}{dT}\right)_{B,p} dB \quad (14)$$

By integration of Eq. (3.14), the adiabatic temperature change for a field change from $B_i$ to $B_f$ is given by $$\Delta T_{ad}(T,\Delta B) = -\int_{B_i}^{B_f} \frac{T}{c_p(T,B)} \left(\frac{dM}{dT}\right)_{B,p} dB \quad (15)$$

Above the Debye temperature, the lattice specific heat of solids approaches the Dulong-Petie limit of 3 R. Therefore, at higher temperatures, if the specific heat can be considered to be only weakly dependent on temperature and the variation of $T/c_p$ (T, B) with temperature is slow compared with the variation of the magnetization with temperature, then, Eq. (15) can be simplified to $$\Delta T_{ad}(T,\Delta B) = -\frac{T}{c_p(T,B)} \Delta SM(T,\Delta B) \quad (16)$$

Obviously, magnetocaloric effect is large when $(dM/dT)_{B,p}$ is larger and $c_p$ (T,B) is small at the small temperature change. Since $(dM/dT)_{B,p}$ peaks around the magnetic ordering temperature, a large magnetocaloric effect is expected in the vicinity of the temperature of the magnetic phase transition.

The determination of the magnetocaloric effect from magnetization, specific heat or the combined magnetization and specific-heat data can be used to characterize the magnetocaloric properties of magnetic refrigerant materials. Magnetization data provides the magnetic-entropy change $\Delta S_M$ (T, $\Delta B$). Specific heat at constant field provides both magnetic-entropy change $\Delta S_M$ (T, $\Delta B$) and adiabatic temperature change $\Delta T_{ad}$ (T, $\Delta B$).

Figure 7:
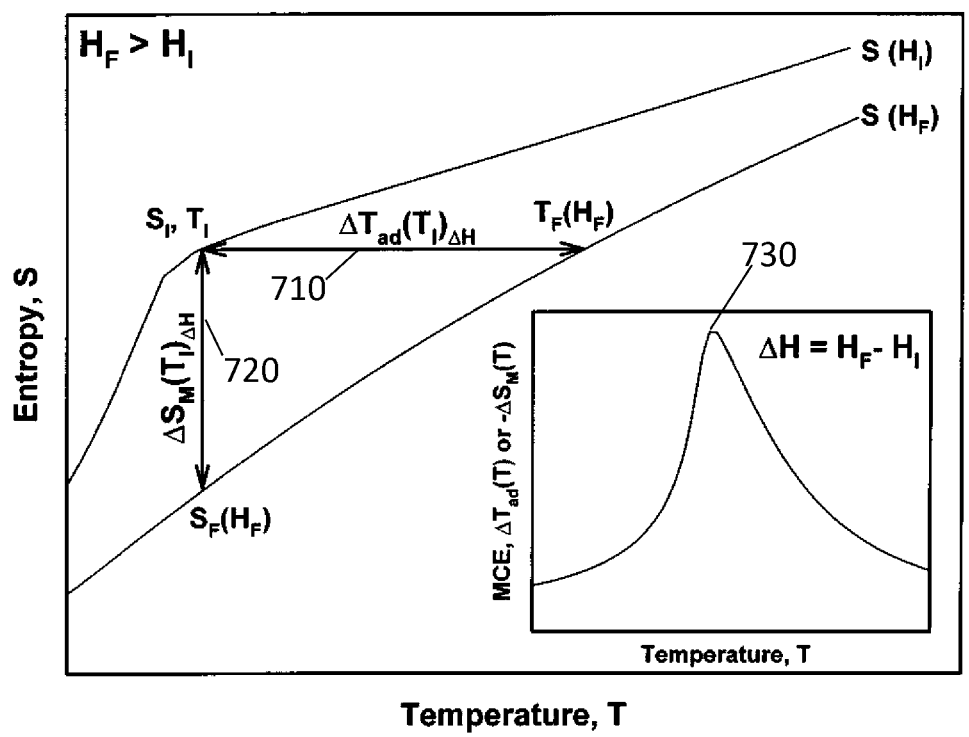
FIG. 7 is an S-T diagram for a ferromagnetic solid, showing the total entropy in magnetic field $H_0$ and $H_1$ ($H_1 > H_0$)

FIG. 7 is an S-T (entropy-temperature) diagram for a ferromagnetic solid, showing the total entropy in magnetic field $H_I$ and $H_F$ ($H_F > H_I$). The diagram also illustrates the magnetocaloric effect which is represented by $\Delta T_{ad}$ 710 or $\Delta S_M$ 720 in the vicinity of the magnetic ordering temperature (Curie temperature $T_C$) 730. The vertical arrow 720 shows the isothermal magnetic entropy change, $\Delta S_M$ whilst the horizontal arrow 710 shows the adiabatic temperature change, $T_{ad}$.

APPENDIX II

Material Examples

Magnetic Measurement.

FIGS. 8 to 11 demonstrate different aspects of magnetic measurement for magnetocaloric materials.

Figure 8:
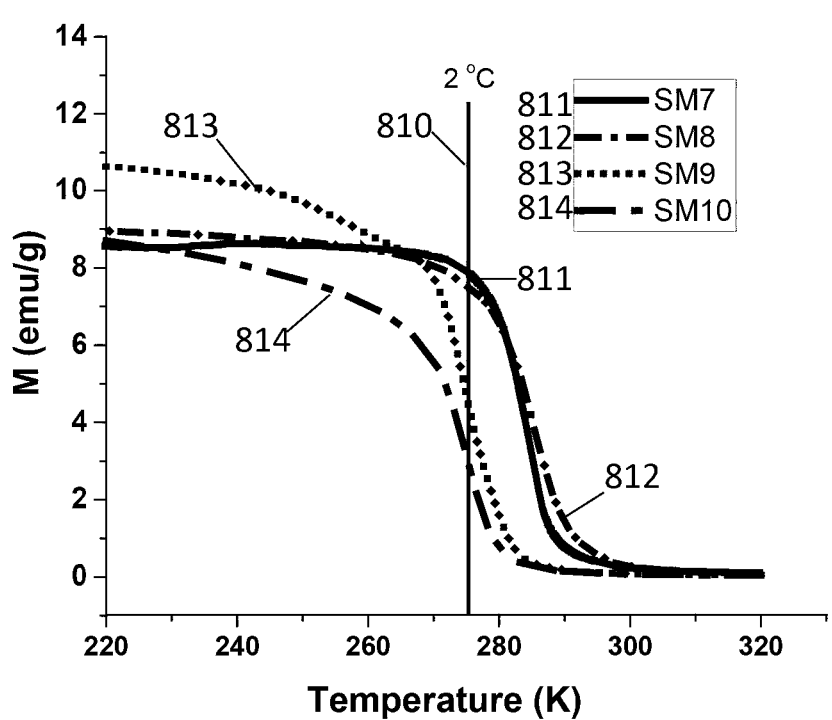
FIG. 8 illustrates temperature dependence of magnetization at 100 Oe for samples of $La_{0.7}Ca_{0.264}Sr_{0.056}MnO_3$ (SM7), $La_{0.7}Ca_{0.264}Sr_{0.056}Ag_{0.03}MnO_3$ (SM8), $La_{0.7}Ca_{0.254}Sr_{0.046}MnO_3$ (SM9), $La_{0.7}Ca_{0.254}Sr_{0.046}Ag_{0.03}MnO_3$ (SM10).
Figure 9A:
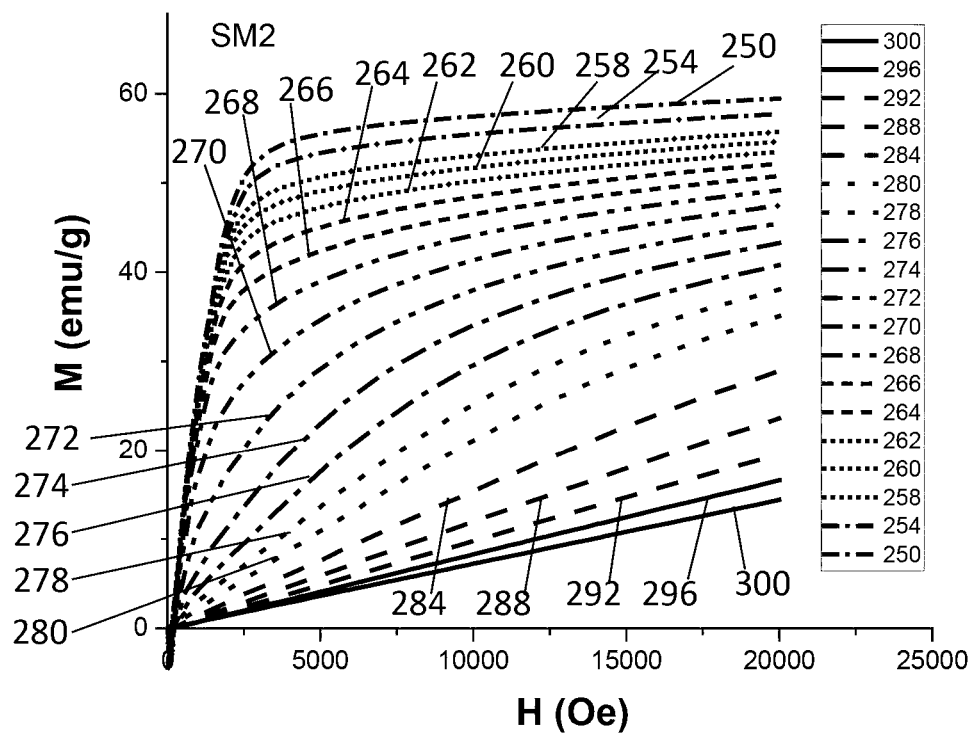
FIG. 9a-d shows magnetization as function of the applied magnetic field at several temperatures for of $La_{0.7}Ca_{0.3}MnO_3$ samples: (a) $La_{0.7}Ca_{0.27}Sr_{0.03}MnO_3$ (SM2), (b) $La_{0.7}Ca_{0.23}Sr_{0.07}MnO_3$ (SM4), and samples of $La_{0.7}(Ca_{1-x}Ag_x)_{0.3}MnO_3$ with (c) x=0.7, and (d) x=1.
Figure 9B:
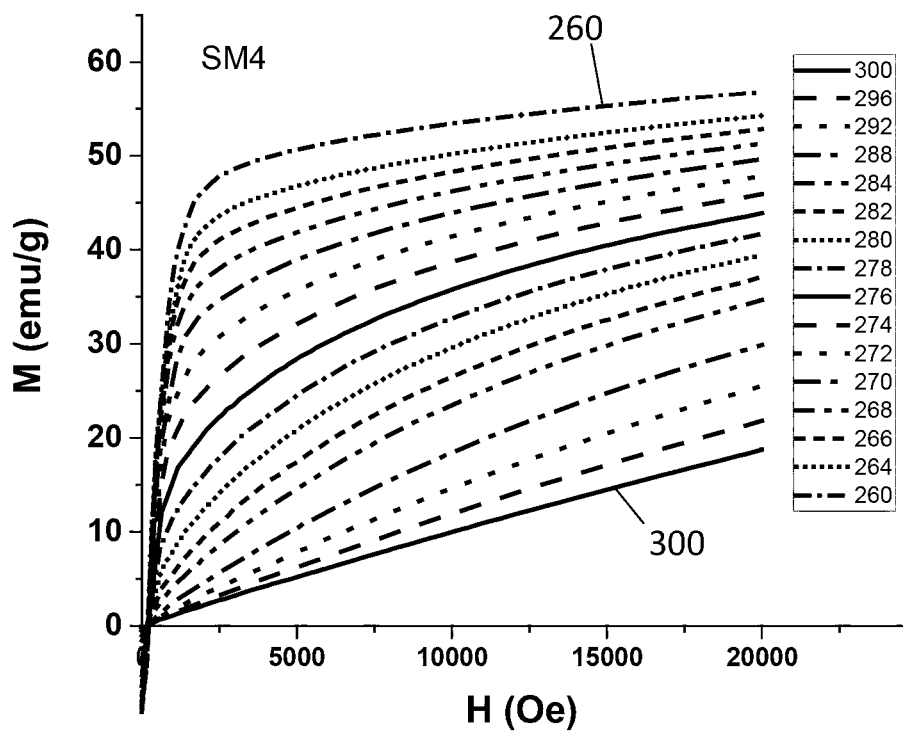
Figure 9C:
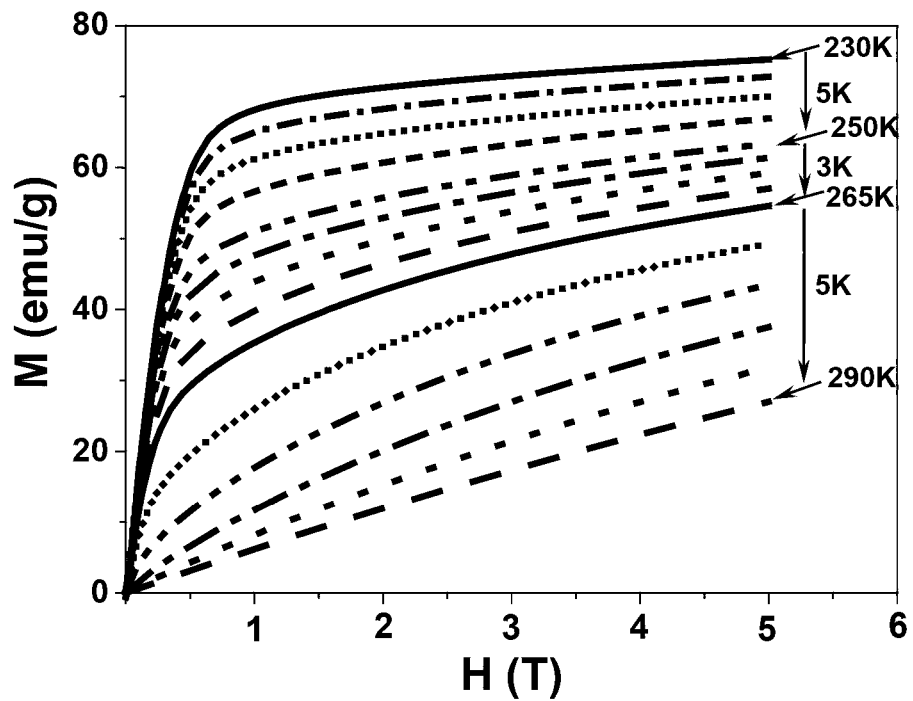
Figure 9D:
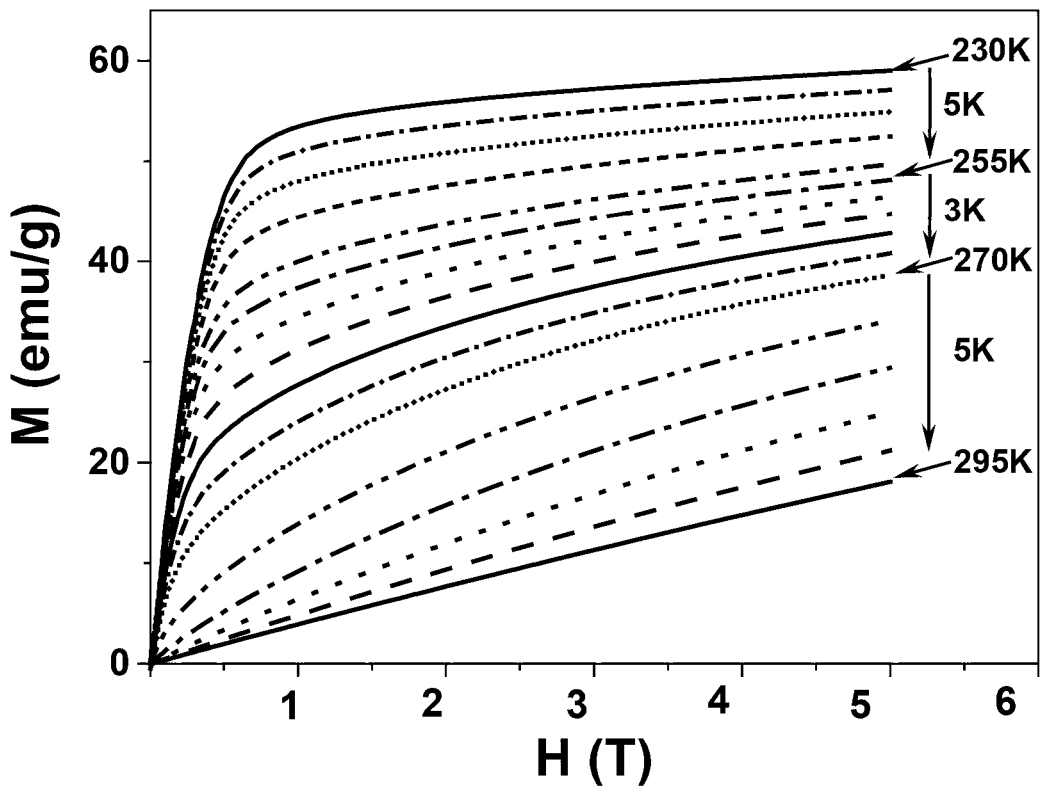

An example of relationship between magnetization (M) and temperature (T) is shown in FIG. 8, which shows temperature dependence of magnetization at 100 Oe for
$La_{0.7}Ca_{0.264}Sr_{0.056}MnO_3$ (SM7),
$La_{0.7}Ca_{0.264}Sr_{0.056}Ag_{0.03}MnO_3$ (SM8),
$La_{0.7}Ca_{0.254}Sr_{0.046}MnO_3$ (SM9),
$La_{0.7}Ca_{0.254}Sr_{0.046}Ag_{0.03}MnO_3$ (SWM10).

Figure 10:
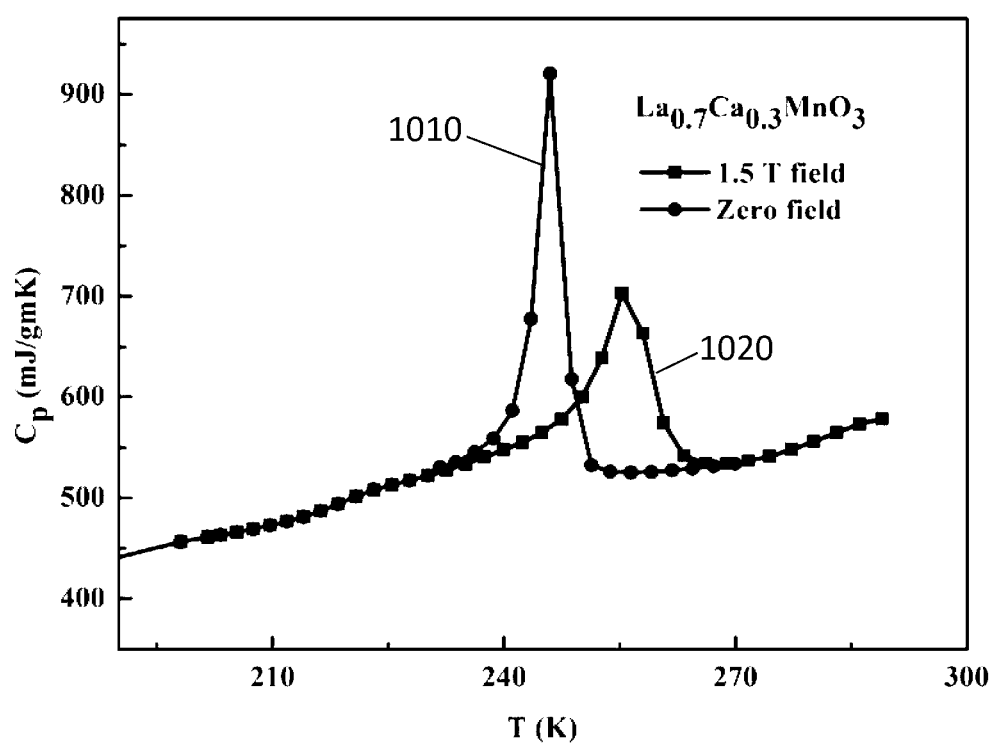
FIG. 10 shows temperature dependence of the heat capacity of the $La_{0.7}Ca_{0.3}MnO_3$ sample for zero and 1.5 T field.
Figure 11A:
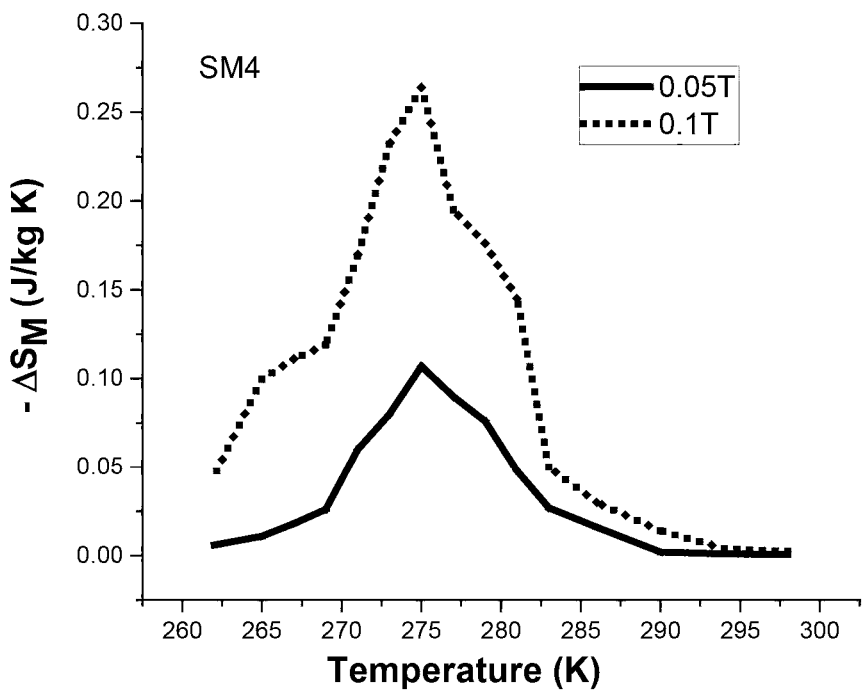
FIG. 11 shows temperature dependence of magnetic entropy change for $La_{0.7}Ca_{0.23}Sr_{0.07}MnO_3$ (SM4) in the applied magnetic fields of (a) H=0.05 T and 0.1 T, (b) H=1 T and 2 T; and also the magnetic entropy change of $La_{0.7}(Ca_{1-x}Ag_x)_{0.3}MnO_3$ with (c) x=0.7, and (d) x=1 as a function of temperature for different magnetic field intervals.
Figure 11B:
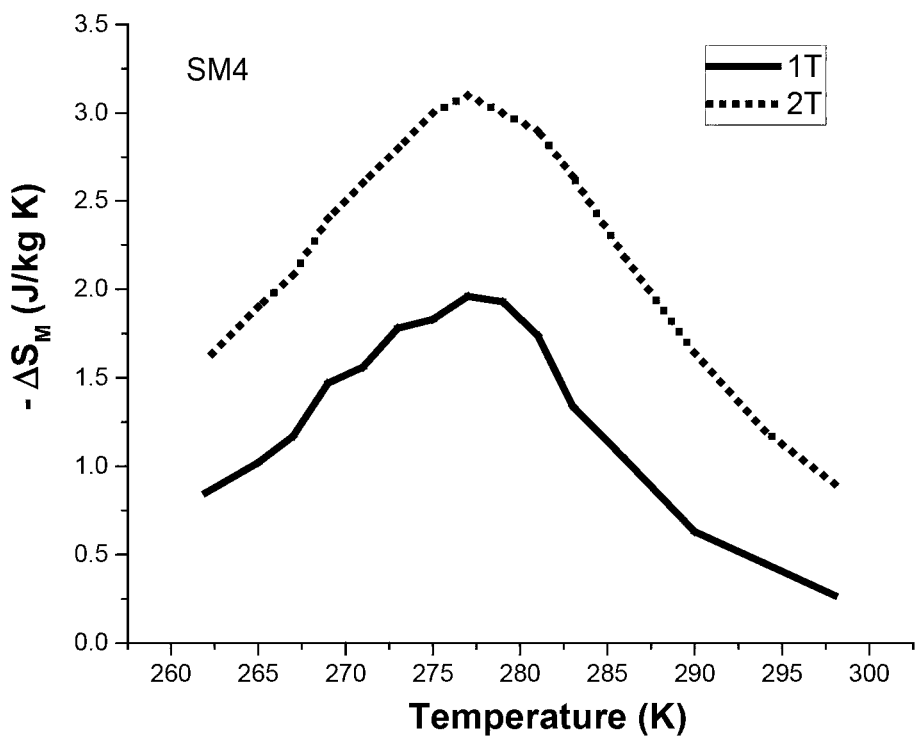
Figure 11C:
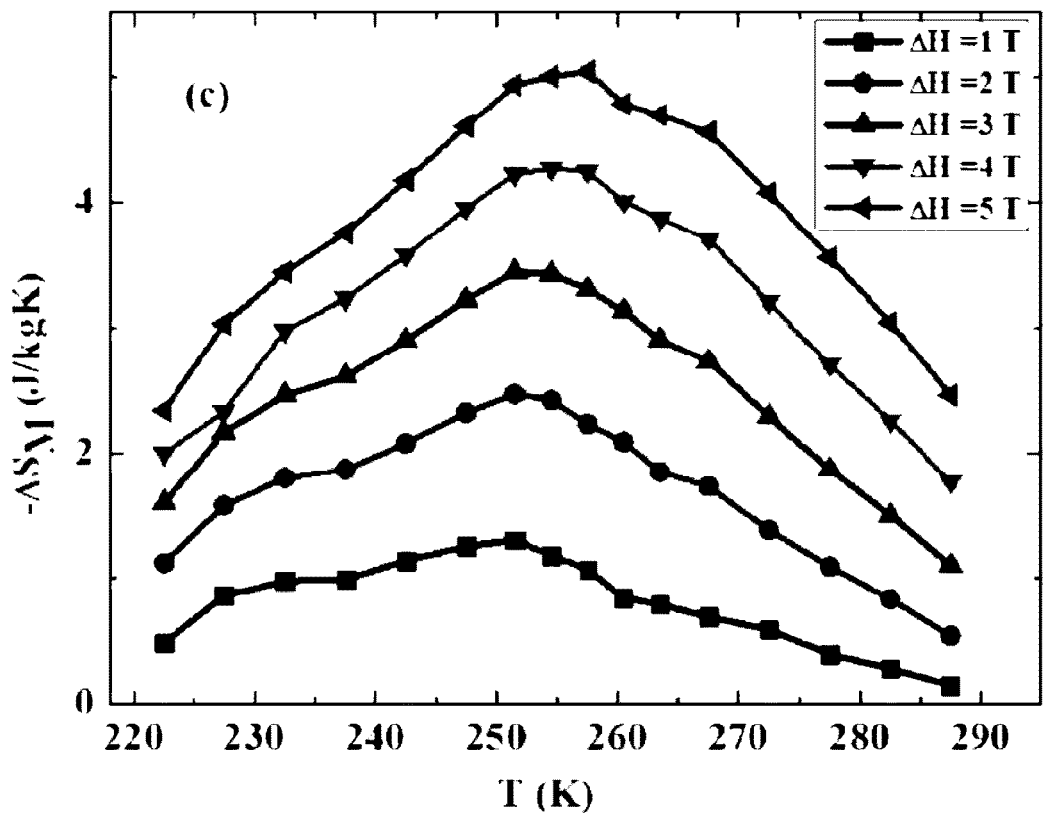
Figure 11D:
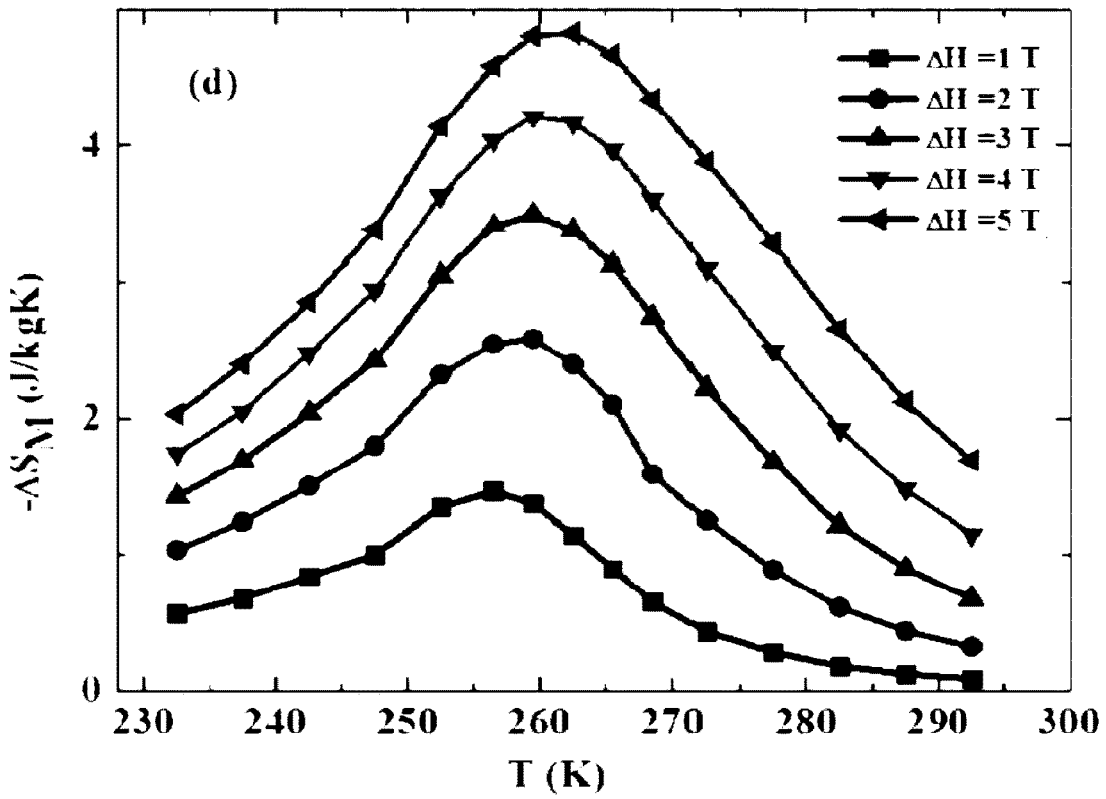

FIG. 9 shows magnetization evolution (M) vs. magnetic applied field (H at several temperatures for $La_{0.7}Ca_{0.3}MnO_3$ based materials: (a) $La_{0.7}Ca_{0.27}Sr_{0.03}MnO_3$ (SM2) (b) $La_{0.7}Ca_{0.23}Sr_{0.07}MnO_3$ (SM4), and $La_{0.7}(Ca_{1-x}Ag_x)_{0.3}MnO_3$ based materials with: (c) x=0.7, (d) x=1;

Heat-capacity (Cp-T) is illustrated in FIG. 10, which shows the temperature dependence of the heat capacity of the $La_{0.7}Ca_{0.3}MnO_3$ sample for zero and 1.5 T magnetic field.

Figure 12:
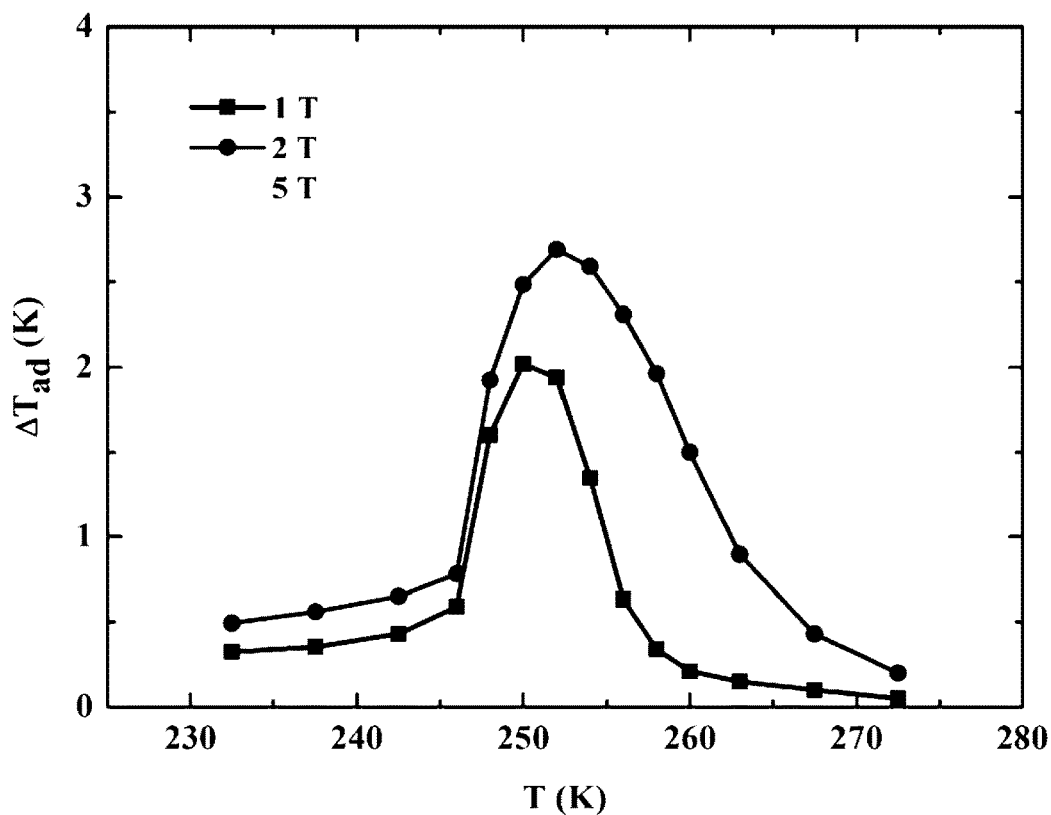
FIG. 12 shows temperature dependence of the adiabatic temperature change of the sample for a field change from 0 to 1, 2, and 5 T.

FIG. 11 shows magnetic entropy change of $La_{0.7}Ca_{0.23}Sr_{0.07}MnO_3$ (SM4) in the magnetic fields of: (a) H=0.05 T and 0.1 T, (b) H=1 T and 2 T, and $La_{0.7}(Ca_{1-x}Ag_x)_{0.3}MnO_3$ based materials with (c) x=0.7, and (d) x=1 samples as a function of temperature for different magnetic field intervals;

The adiabatic temperature change $(\Delta T_{ad})$ of the $La_{0.7}Ca_{0.3}MnO_3$ for the temperature range of 230-275 K is shown in FIG. 12. The estimated $\Delta T_{ad}$ values are 2.02, 2.69, and 3.62 K for field changes from 0 to 1, 2, and 5 T, respectively.

These experimental results demonstrate:
(1) the as-developed materials possess giant magnetocaloric effects;
(2) ability to tune the magnetic transition temperatures of these materials to suit the application to electric transmission lines for regulating operating temperature to remain within a desired operation temperature range;
(3) the magnetocaloric effects ($\Delta S_M$ and $\Delta T_{ad}$) of these materials are large, showing effective heating behavior for Anti-/de-icing application of electric transmission lines;
(4) several magnetic measurement methodologies for further evaluating new giant magnetocaloric materials for the applications of Climate Responsive Transmission Lines.

It will be understood to persons skilled in the art of the invention that many modifications may be made without departing from the spirit and scope of the invention.

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

It is to be understood that, if any prior art publication is referred to herein, such reference does not constitute an admission that the publication forms a part of the common general knowledge in the art, in Australia or any other country.

The invention claimed is:

1. An electrical power transmission line conductor comprising:
at least one electrical conductor configured for transmission of high voltage alternating current electrical power;
at least one strengthening structure bundled with the electrical conductor to provide physical support to the electrical conductor; and
at least one magnetocaloric structure comprising magnetocaloric material, the at least one magnetocaloric structure being included in a bundle with the electrical conductor and strengthening structure,
the magnetocaloric structure being arranged within the bundle to be located within a changing magnetic field generated by transmission of high voltage alternating current electrical power via the at least one conductor to thereby cause the magnetocaloric material composition to exhibit a magnetocaloric effect to regulate the operating temperature of the electrical power transmission line conductor.

2. An electrical power transmission line conductor as claimed in claim 1 wherein the magnetocaloric effect operates to regulate the operating temperature of the electrical power transmission line conductor to maintain operating temperature above a range where icing occurs.

3. An electrical power transmission line conductor as claimed in claim 2 wherein one or more magnetocaloric structures include magnetocaloric material configured to exhibit magnetocaloric effects to cause warming of the electrical power transmission line conductor at temperatures below an icing threshold temperature.

4. An electrical power transmission line conductor as claimed in claim 3 wherein the magnetocaloric material has a material composition including any one or more of:
$La_{0.7}(Ca_{1-x}Ag_x)_{0.3}MnO_3$, $La_{0.7}Ca_{0.3}MnO_3$, $LaMnO_3$, $MnCoGe$, $MnAs$, $Mn_{1-x}Fe_xAs$ $MnCoGe$, $LaFe_{11.6}Si_{1.4}$, $La(FeSi)_{13}$, $La_{0.8}Nd_{0.2}Fe_{11.5}Si_{1.5}$, $Ni_{43}Mn_{46}Sn_{11}$, $(Mn_{1-x}Ni_x)_3Sn_2$, and $RMnO_3$.

5. An electrical power transmission line conductor as claimed in claim 4 wherein the magnetocaloric material composition is tuned to exhibit the magnetocaloric effect below the icing threshold temperature by doping using any one or more of Ag, Co, Cu, B, H or Gd.

6. An electrical power transmission line conductor as claimed in claim 3 wherein the icing threshold temperature is a temperature selected from a range of 5° C. to 0° C.

7. An electrical power transmission line conductor as claimed in claim 3 wherein the magnetocaloric material configured to exhibit magnetocaloric effects to cause warming of the electrical power transmission line conductor to regulate the operating temperature to within a range of 5° C. to 0° C. in ambient temperatures in the range of 5° C. to −50° C.

8. An electrical power transmission line conductor as claimed in claim 1 wherein the magnetocaloric effect operates to regulate the operating temperature of the electrical power transmission line conductor to maintain operating temperature below a high temperature threshold.

9. An electrical power transmission line conductor as claimed in claim 8 wherein one or more magnetocaloric structures include magnetocaloric material configured to exhibit magnetocaloric effects to cause cooling of the electrical power transmission line conductor at temperatures above an high-heat threshold temperature.

10. An electrical power transmission line conductor as claimed in claim 9 wherein the magnetocaloric material comprises any one or more of: Zn doped $Fe_3O_4$; $Ni_{0.50}Mn_{0.50-x}Sn_x$, $Ni_{0.50}Mn_{0.50-x}In_x$ and $Ni_{0.50}Mn_{0.50-x}Sb_x$ alloys; and $LaCrO_3$.

11. An electrical power transmission line conductor as claimed in claim 9 wherein the magnetocaloric material composition is tuned to exhibit the magnetocaloric effect above the high-heat threshold temperature by doping using any one or more of gold (Ag), cobalt (Co), copper (Cu), boron (B), hydrogen (H) or gadolinium (Gd).

12. An electrical power transmission line conductor as claimed in claim 9 wherein the high-heat threshold temperature is a temperature selected from within the range of 40° C. to 100° C.

13. An electrical power transmission line conductor as claimed in claim 9 wherein the magnetocaloric material configured to exhibit magnetocaloric effects to cause cooling of the electrical power transmission line conductor to regulate the operating temperature to within a range of 40° C. to 100° C. in ambient temperatures in the range of 30° C. to 60° C.

14. An electrical power transmission line conductor as claimed in claim 1 wherein the magnetocaloric effect operates to regulate the operating temperature of the electrical power transmission line conductor to maintain operating temperature within a target operating range.

15. An electrical power transmission line conductor as claimed in claim 14 wherein one or more magnetocaloric structures include magnetocaloric material configured to exhibit magnetocaloric effects to cause warming of the electrical power transmission line conductor at temperatures below an icing threshold temperature.

16. An electrical power transmission line conductor as claimed in claim 1 wherein the magnetocaloric material composition for each magnetocaloric structure is tuned to exhibit the magnetocaloric effect within a target temperature range.

17. An electrical power transmission line conductor as claimed in claim 1 wherein each magnetocaloric structure is configured as an elongate wire comprising the magnetocaloric material, the wire being incorporated into the bundle with the electrical conductor and strengthening structure.

18. An electrical power transmission line conductor as claimed in claim 17 wherein each magnetocaloric structure is formed using a power-in-tube method for forming the elongate wire comprising the magnetocaloric material.

19. A method of electrical power transmission line conductor design comprising the steps of:
  determining an anticipated operating temperature range for the electrical power transmission line conductor, and selecting at least one of a low temperature threshold and a high temperature threshold;
  selecting one or more magnetocaloric materials exhibiting magnetocaloric effects around the selected low temperature threshold or high temperature threshold; and
  determining an arrangement for at least one electrical conductor, at least one strengthening structure and one or more magnetocaloric structures within a conductor bundle, the position of the magnetocaloric structures being selected to ensure the position magnetocaloric structures will coincide with the changing magnetic field generated by alternating current electrical power transmission via conductors in the bundle.

20. A method as claimed in claim 19 wherein the step of selecting one or more magnetocaloric materials includes a step of tuning temperature for exhibition of the magnetocaloric effect to coincide with the selected low temperature threshold or high temperature threshold.

* * * * *